(12) United States Patent
Broyde et al.

(10) Patent No.: US 8,248,177 B2
(45) Date of Patent: Aug. 21, 2012

(54) METHOD AND DEVICE FOR PSEUDO-DIFFERENTIAL TRANSMISSION

(75) Inventors: Frédéric Broyde, Maule (FR); Evelyne Clavelier, Maule (FR)

(73) Assignee: EXCEM SAS, Maule (FR)

( * ) Notice: Subject to any disclaimer, the term of this patent is extended or adjusted under 35 U.S.C. 154(b) by 482 days.

(21) Appl. No.: 12/599,086

(22) PCT Filed: May 29, 2008

(86) PCT No.: PCT/IB2008/052102
§ 371 (c)(1),
(2), (4) Date: Nov. 6, 2009

(87) PCT Pub. No.: WO2009/013644
PCT Pub. Date: Jan. 29, 2009

(65) Prior Publication Data
US 2010/0253446 A1    Oct. 7, 2010

(51) Int. Cl.
*H01P 5/12* (2006.01)
(52) U.S. Cl. ............... 333/1; 333/33; 333/125
(58) Field of Classification Search ............. 333/1, 125, 333/33, 24 R; 326/26
See application file for complete search history.

(56) References Cited

U.S. PATENT DOCUMENTS

| | | | | |
|---|---|---|---|---|
| 5,805,030 | A * | 9/1998 | Dhuey et al. | 333/1 |
| 6,040,524 | A * | 3/2000 | Kobayashi et al. | 174/36 |
| 6,195,305 | B1 | 2/2001 | Fujisawa et al. | |
| 7,167,019 | B2 * | 1/2007 | Broyde et al. | 326/30 |
| 7,362,130 | B2 * | 4/2008 | Broyde et al. | 326/30 |
| 7,408,426 | B2 * | 8/2008 | Broyde et al. | 333/100 |
| 7,477,069 | B2 * | 1/2009 | Broyde et al. | 326/30 |
| 7,764,083 | B2 * | 7/2010 | Broyde et al. | 326/30 |
| 8,049,576 | B2 * | 11/2011 | Broyde et al. | 333/125 |
| 8,174,334 | B2 * | 5/2012 | Broyde et al. | 333/1 |
| 8,193,875 | B2 * | 6/2012 | Broyde et al. | 333/125 |
| 2006/0267633 | A1 | 11/2006 | King | |

(Continued)

FOREIGN PATENT DOCUMENTS

FR    2849728 A1    7/2004

(Continued)

OTHER PUBLICATIONS

Broyde et al., "A new pseudo-differential transmission scheme for on-chip and on-board interconnections", Proc. of the CEM 08 Int. Symp. on Electromagnetic Compatibility; Paris; May 2008; session C7.*

(Continued)

*Primary Examiner* — Dean O Takaoka
*Assistant Examiner* — Alan Wong
(74) *Attorney, Agent, or Firm* — Barnes & Thornburg LLP

(57) ABSTRACT

The invention relates to a method and a device for pseudo-differential transmission in interconnections used for sending a plurality of electrical signals. The ends of an interconnection having 4 transmission conductors and a return conductor distinct from the reference conductor are each connected to a termination circuit. Three damping circuits are connected between the return conductor and the reference conductor. The transmitting circuits receive at their inputs the signals from the 4 channels of the two sources, and are connected to the conductors of the interconnection. The receiving circuits are connected to the conductors of the interconnection, each receiving circuit being such that the 4 channels of a source connected to a transmitting circuit in the activated state are sent to the four channels of the destinations without noticeable external crosstalk.

14 Claims, 12 Drawing Sheets

U.S. PATENT DOCUMENTS

| | | | |
|---|---|---|---|
| 2007/0117446 A1 | 5/2007 | Broyde et al. | |
| 2011/0074488 A1* | 3/2011 | Broyde et al. | 327/365 |
| 2011/0121914 A1* | 5/2011 | Broyde et al. | 333/125 |
| 2011/0248577 A1* | 10/2011 | Broyde et al. | 307/149 |

FOREIGN PATENT DOCUMENTS

| | | |
|---|---|---|
| FR | 2917921 A1 * 12/2008 | |

OTHER PUBLICATIONS

International Search Report for International Application No. PCT/IB2008/052102, dated Oct. 22, 2008.

Broyde F et al: "A New Method for the Reduction of Crosstalk and Echo in Multiconductor Interconnections", IEEE Transactions on Circuits and Systems I: Fundamental Theory and Applications, IEEE Inc., New York, US, vol. 52, No. 2, Feb. 2005, pp. 405-416, XP011126847, ISSN: 1057-7122, cited in the application abstract * Alineas I-IV et XI *.

Abushaaban M et al: "Modal Circuit Decomposition of Lossy Multiconductor Transmission Lines", IEEE Transactions on Microwave Theory and Techniques, IEEE Service Center, Piscataway, NJ, US, vol. 44, No. 7, Jul. 1996, XP011036447, ISSN: 0018-9480, *Alineas I-III * abstract.

* cited by examiner

METHOD AND DEVICE FOR PSEUDO-DIFFERENTIAL TRANSMISSION

CROSS-REFERENCE TO RELATED APPLICATIONS

The present application claims the benefit of priority to International Patent Application No. PCT/IB2008/052102 filed 29 May 2008, which further claims the benefit of priority to France Patent Application No. 0705260 filed 20 Jul. 2007, the contents of which are incorporated herein by reference in their entirety.

FIELD OF THE INVENTION

The invention relates to a method and a device for pseudo-differential transmission through interconnections used for sending a plurality of electrical signals, such as the interconnections made with multiconductor cables, or with the traces of a printed circuit board, or inside an integrated circuit.

The French patent application Ser. No. 07/05260 of 20 Jul. 2007, entitled "Procédé et dispositif pour les transmissions pseudo-différentielles" is incorporated by reference.

PRIOR ART

Let us consider the problem of transmission through an interconnection, for obtaining m transmission channels, m being an integer greater than or equal to 2. Each transmission channel may be used for transmitting signals of any type, for instance analog signals or digital signals, from a source to a destination. We consider here that a digital signal is a signal whose value is defined only at discrete points in time, the set of the values that the signal may take on being discrete. We consider also that each value of a digital signal corresponds to a voltage or current interval. This definition of a digital signal as a "digital signal defined by voltage or current intervals" includes:

the binary signals used in binary signaling, that is to say any signal such that, in each transmission channel, the set of the values that this signal may take on has 2 elements;

the N-ary signals (N being an integer greater than or equal to 3) used in multilevel signaling, that is to say any signal such that, in each transmission channel, the set of the values that this signal may take on has N elements.

Binary signals are the signals which are the most frequently used today by digital integrated circuits, for instance the integrated circuits of the HCMOS family, which is well known to specialists. Multilevel signals, for instance quaternary signals (sometimes referred to as PAM-4 or 4-PAM), are used to obtain high bit rates.

We will consider that any signal which does not comply with this definition of a digital signal is an analog signal. Consequently, the result of any type of modulation of a carrier by a digital signal will be regarded as an analog signal.

Said transmission may be obtained through an interconnection comprising n+1 conductors, among which n transmission conductors, with n=m. A device for transmission in such an interconnection is shown in FIG. 1, this device comprising an interconnection (1) having n=4 transmission conductors (11) (12) (13) (14) and a reference conductor (7), that is to say a ground conductor. In FIG. 1, each end of the interconnection is connected to a termination circuit (4). The transmitting circuit (5) receives at its input the signals of the 4 channels of the source (2), and its 5 output terminals are connected to the conductors of the interconnection (1), one of these conductors being ground. The receiving circuit (6) has its 5 input terminals connected to the conductors of the interconnection (1), one of these conductors being ground. The device shown in FIG. 1 provides 4 transmission channels, such that the signals of the 4 channels of the source (2) are sent to the 4 channels of the destination (3). The device shown in FIG. 1 is somewhat general. For instance, according to the case, one and/or the other termination could comprise no component. For instance, according to the case, the transmitting circuit (5) and/or the receiving circuit (6) could comprise no component. However, devices differing from the one shown in FIG. 1 are also conceivable, for instance devices for transmission comprising several sources and/or several destinations, based on a data bus architecture.

The simplest transmission method for obtaining m transmission channels uses m single-ended links. Using m single-ended links, each transmission channel uses one transmission conductor of the interconnection, and the reference conductor (ground) is used for the return current produced by the currents flowing on the m transmission conductors. This scheme may be implemented according to FIG. 1. This method is subject to two detrimental phenomena: echo and crosstalk.

The prior art concerning transmission without echo and without crosstalk, applicable to this patent application, is set out in the 3 following patents:

the French patent number 0300064 of 6 Jan. 2003 entitled "Procédé et dispositif pour la transmission avec une faible diaphonie", corresponding to the international application number PCT/EP2003/015036 of 24 Dec. 2003 (WO 2004/062129), entitled "Method and device for transmission with reduced crosstalk";

the French patent number 0302814 of 6 Mar. 2003 entitled "Procédé et dispositif numériques pour la transmission avec une faible diaphonie", corresponding to the international application number PCT/EP2004/002382 of 18 Feb. 2004 (WO 2004/079941), entitled "Digital method and device for transmission with reduced crosstalk";

the French patent number 0303087 of 13 Mar. 2003 entitled "Procédé et dispositif pour la transmission sans diaphonie", corresponding to the international application number PCT/EP2004/002383 of 18 Feb. 2004 (WO 2004/082168), entitled "Method and device for transmission without crosstalk".

The inventions described in these three patents may be implemented according to FIG. 1. The article of F. Broydé and E. Clavelier entitled "A New Method for the Reduction of Crosstalk and Echo in Multiconductor Interconnections", published in the journal *IEEE Transactions on Circuits and Systems I*, vol. 52, No. 2, pages 405 to 416, in February 2005, corrected and supplemented by the article of F. Broydé and E. Clavelier entitled "Corrections to <<A New Method for the Reduction of Crosstalk and Echo in Multiconductor Interconnections>>", published in the journal *IEEE Transactions on Circuits and Systems I*, vol. 53, No. 8, p. 1851 in August 2006, proves that the inventions described in said French patents number 0300064, number 0302814 and number 0303087 are indeed suitable for removing crosstalk between the different transmission channels obtained with said interconnection, and also for removing echo.

However, there are other crosstalk phenomena which may produce noise. Such phenomena are produced by some electromagnetic couplings between some conductors of said interconnection and other nearby conductors, for instance when said interconnection and these other conductors are built on the same printed circuit board. Such an "other nearby conductor" may for instance be a power supply conductor, a conductor of a link for digital signals, etc. We shall refer to these phenomena as "external crosstalk", for distinguishing them from crosstalk between said transmission channels, which shall be referred to as "internal crosstalk".

For instance, let us consider a loop A comprising one of said other conductors and a return path for the current. The variable currents flowing in this loop A may induce disturbance voltages in a loop B used for transmission in said interconnection. Conversely, the variable currents flowing in this loop B used for transmission in said interconnection may induce disturbance voltages in said loop A. In both cases, the disturbance voltage caused by external crosstalk is a noise proportional to the absolute value of the common impedance between the loop A and the loop B. We may distinguish two cases:

when said loop A and said loop B have no conductor in common, the common impedance is only produced by mutual induction;

when said loop A and said loop B have a conductor in common, the common impedance comprises a resistance and the reactance produced by mutual induction.

In the second case, the partial mutual inductance per unit length of the path in the conductor in common is generally much larger than the partial mutual inductance per unit length of the path in the distinct conductors (see the book of F. W. Grover entitled "Inductance Calculation", published by Dover Publications). Consequently, we may say that the presence of a conductor in common tends to produce a strong coupling between the loop A and the loop B.

A transmission scheme using the reference conductor, which is often called the ground conductor, as a return path for the return current produced by the currents flowing in the n transmission conductors, will therefore often suffer from a strong coupling between said transmission channels and the variable currents injected into the reference conductor by other conductors. For instance, the variable current flowing in a power supply conductor power feeding an integrated circuit will produce a return current flowing in the reference conductor, if the reference conductor is used for the return of power supply currents, as is the case for the low-voltage CMOS digital integrated circuits of the LVC family, well known to specialists. For instance, the variable current of a conductor of another signal link will produce a return current flowing in the reference conductor, if the reference conductor is used by this signal link for the return of the currents inherent to the signals, as is the case for said LVC family.

The particular case of external crosstalk involving ground as a conductor in common to the loop A and the loop B is sometimes called "ground noise" or "ground bounce".

If the interconnection is used for building m single-ended links, the reference conductor (ground) is used for the return current produced by the currents flowing on the n=m transmission conductors, as in the case shown in FIG. 1. This scheme is consequently vulnerable to external crosstalk (it is also subject to internal crosstalk).

If the interconnection is used according to one of the inventions described in said French patents number 0300064, number 0302814 and number 0303087, the reference conductor (ground) is also used for the return current produced by the currents flowing on the n transmission conductors, as shown in FIG. 1. These inventions, which are suitable for reducing or eliminating internal crosstalk, are therefore prone to external crosstalk.

However, there are transmission methods intended to provide a good protection against external crosstalk: differential links (see for instance the book of H. W. Johnson and M. Graham entitled *High-speed digital design: a handbook of black magic*, published by Prentice Hall PTR in 1993), and pseudo-differential links (see for instance the section II of the paper of A. Carusone, K. Farzan and D. A. Johns entitled "Differential signaling with a reduced number of signal paths" published in *IEEE Trans. Circuits Syst. II*, vol. 48, No. 3, pp. 294-300 in March 2001 and the section 4.2.3 of the book of F. Yuan entitled *CMOS current-mode circuits for data communications*, published by Springer in 2007).

A differential device for transmission providing m transmission channels uses an interconnection having n=2m transmission conductors. A pseudo-differential device for transmission providing m transmission channels uses an interconnection having n=m transmission conductors and a common conductor distinct from the reference conductor (ground).

It should be noted that the wording "pseudo-differential" is also applied to devices which are not related in any way to pseudo-differential transmission. For instance, the patent application number US 2006/0267633 of the United States of America entitled "Pseudo-differential output driver with high immunity to noise and jitter" relates to a device having one differential input channel and one single-ended output channel: this device is not related to pseudo-differential transmission in any way. For instance, the U.S. Pat. No. 5,638,322 of the United States of America entitled "Apparatus and method for improving common mode noise rejection in pseudo-differential sense amplifiers" relates to sense amplifiers which to some extent look like conventional differential amplifiers: this invention is not related to pseudo-differential transmission in any way.

A pseudo-differential device for transmission is shown in FIG. 2, this device comprising an interconnection (1) having n=4 transmission conductors (11) (12) (13) (14) plus a common conductor (10) distinct from the reference conductor (7). Let us stress that the common conductor (10) is not related at all to the previous discussion relating to loops having "a conductor in common".

In FIG. 2, the transmitting circuit (5) receives at its input the signals of the 4 channels of the source (2), and its 5 output terminals are connected to the n+1=5 conductors of the interconnection (1), one of these conductors being the common conductor (10). The receiving circuit (6) has its 5 input terminals connected to the conductors of the interconnection (1), one of these conductors being the common conductor (10). The receiving circuit (6) produces voltages at its output terminals connected to the destination (3), each of these voltages being determined by one and only one of the voltages between one of the transmission conductors and the common conductor. The device shown in FIG. 2 provides 4 transmission channels, such that the signals of the 4 channels of the source (2) are sent to the 4 channels of the destination (3).

In FIG. 2, there is no termination circuit, as is the case in the patent of the United States of America U.S. Pat. No. 5,818, 261 entitled "Pseudo-differential bus driver/receiver for field programmable devices", in the patent of the United States of America U.S. Pat. No. 5,994,925 entitled "Pseudo-differential logic receiver" and in the patent of the United States of America U.S. Pat. No. 7,099,395 entitled "Reducing coupled noise in pseudo-differential signaling". Consequently, in the case of FIG. 2, substantial reflections of signals occur, and the specialists know that this implies limitations on the length L of the interconnection (L must be sufficiently small) and on the available bandwidth.

In FIG. 2, since no termination is present, there is no constraint on the manner of routing the interconnection (1) with respect to ground (7). Consequently, in FIG. 2, the reference conductor (7) is represented as an irregular geometrical shape, such that the distance between the conductors of the interconnection (1) and the reference conductor (7) varies as a function of the abscissa z along the interconnection. This implies that it is a priori not possible to model propagation in the interconnection using a multiconductor transmission line having n+2=6 conductors, the multiconductor transmission line having uniform electrical characteristics over its length.

Two other pseudo-differential devices for transmission are shown in FIG. 3 and in FIG. 4, these devices each comprising:

an interconnection (1) having n=4 transmission conductors (11) (12) (13) (14) plus a common conductor (10) distinct from the reference conductor (7);

a transmitting circuit (5) receiving at its input the signals of the 4 channels of the source (2);

a receiving circuit (6) having its output connected to the destination (3).

In the FIGS. 3 and 4, we find a termination (4), as in the patent of the United States of America U.S. Pat. No. 6,195, 395 entitled "Multi-agent pseudo-differential signaling scheme". In the case of FIG. 3, the termination (4) is made of m=4 resistors (401) (402) (403) (404) each connected between a transmission conductor and ground. In the case of FIG. 4, the termination (4) is made of m+1=5 resistors, m=4 resistors (401) (402) (403) (404) being connected as in FIG. 3, and a resistor (410) being connected between the common conductor (10) and the reference conductor (7).

In FIGS. 3 and 4, instead of being connected to ground, the resistors of the termination (4) could be connected to a node intended to present a fixed voltage with respect to ground, for instance a power supply voltage. This technique is for instance used in the pseudo-differential signaling scheme using integrated circuits of the Gunning Transceiver Logic (GTL) family, which is well known to specialists. Each resistor connected to a conductor of the interconnection (1) could also be replaced with another known type of termination (see for instance the chapter 6 of the above-mentioned book of H. W. Johnson and M. Graham), for instance a split termination (also referred to as "Thevenin termination") comprising 2 resistors, the first resistor being inserted between this conductor of the interconnection and ground, the second resistor being inserted between this conductor of the interconnection and a node presenting a fixed voltage with respect to ground.

In FIGS. 3 and 4, since a grounded termination (4) is used to avoid the reflection of signals propagating along the interconnection (1), it is clear for the specialist that the interconnection must be designed in such a way that it is possible to model the propagation in the interconnection using a multiconductor transmission line having n+2=6 conductors, the multiconductor transmission line having uniform electrical characteristics over its length, the multiconductor transmission line using as variables the n natural voltages (which are defined with respect to the reference conductor) and the n natural currents flowing on the transmission conductors and on the common conductor. This result is typically obtained with a geometry of the interconnection (1) and the reference conductor (7) such that the cross section of the interconnection (1) and the reference conductor (7), in a plane orthogonal to the direction of propagation, does not change over the greatest part of the length of the interconnection, in the vicinity of the transmission conductors. In order to indicate this requirement, the reference conductor (7) is, in the FIGS. 3 and 4, represented as a uniform geometrical shape, such that the distance between the conductors of the interconnection (1) and the reference conductor (7) does not vary as a function of the abscissa z along the interconnection.

In FIGS. 3 and 4, the use of a termination (4) made of resistors connected to ground for avoiding the reflection of signals propagating along the interconnection (1) also implies that this termination may provide an impedance matrix not too different from the characteristic impedance matrix of said multiconductor transmission line having n+2 conductors. The specialists understand that this may happen only if the characteristic impedance matrix of said multiconductor transmission line having n+2 conductors is such that the absolute value of each of the diagonal components is much larger than the absolute value of each of the non-diagonal components, in a suitable frequency band. This implies that the transmission conductors are in a way closer to the reference conductor (7) than to the common conductor (10).

The FIGS. 5 and 6 show each a cross section of the interconnection (1) and the reference conductor (7), in a plane orthogonal to the direction of propagation, for interconnections built in or on a printed circuit board. For each of these interconnections, the characteristic impedance matrix of said multiconductor transmission line having n+2 conductors is such that the absolute value of each of the diagonal components is much larger than the absolute value of each of the non-diagonal components. FIG. 5 corresponds to a microstrip structure comprising the conductors of the interconnection (10) (11) (12) (13) (14) and a reference conductor (7) made of a ground plane. FIG. 6 corresponds to a stripline structure comprising the conductors of the interconnection (10) (11) (12) (13) (14) and a reference conductor (7) made of an upper ground plane (71) and a lower ground plane (72), these two ground planes being sufficiently connected the one to the other, using vias (not shown in FIG. 6). The lower ground plane (72) could for instance be replaced with a power plane. In this case, the connections between the two planes (71) (72) would be made through capacitors.

As indicated in said patent of the United States of America U.S. Pat. No. 6,195,395, the state of the art as regards fighting against external crosstalk requires that the routing of all transmission conductors and of the common conductor must be matched, so that substantially equal noise voltages are obtained on all conductors of the interconnection. This seems to be achieved for the configurations shown in FIGS. 5 and 6. Unfortunately, we see that, in FIGS. 5 and 6, the common conductor (10) is close to a transmission conductor (14), but far from other transmission conductors (11) (12). The currents flowing into the reference conductor (7) because of a loop A will consequently induce different voltages in the different conductors of the interconnection, and it will not be possible to eliminate the external crosstalk.

Consequently, the specialist understands that, according to the state of the art, there is a discrepancy between an effective protection against external crosstalk which implies that the transmission conductors are in a way closer to the common conductor than to the reference conductor, and reduced reflections which imply that the transmission conductors are in a way closer to the reference conductor than to the common conductor.

Consequently, there is no known method for transmission through an interconnection having n+1 conductors, effectively protected against external crosstalk and capable of operating with reduced reflections.

The French patent application Ser. No. 07/04421 of 21 Jun. 2007, entitled "Dispositif d'interface pseudo-différentiel avec circuit de terminaison" and the international application number PCT/IB2008/051826 of 8 May 2008, entitled "Pseudo-differential interfacing device having a termination circuit", describe terminations which do not produce return currents flowing mainly in the reference conductor or in a power supply conductor. Such terminations may therefore be used to improve pseudo-differential transmission.

However, prior art does not describe the conditions, relating to the structure of the interconnection and to proportioning of such terminations, which provide an effective reduction of reflections and external crosstalk. Consequently, there is no known method for transmission through an interconnection having n+1 conductors, effectively protected against external crosstalk and capable of operating with reduced reflections.

DESCRIPTION OF THE INVENTION

The purpose of the method of the invention is the transmission through an interconnection having two or more transmission conductors, reflections at least one end of the interconnection being reduced, and the transmission being protected against external crosstalk.

The invention is about a method for transmitting through an interconnection having n transmission conductors and a return conductor distinct from the reference conductor, n being an integer greater than or equal to 2, the interconnection being structurally combined with the reference conductor throughout the length of the interconnection, the method providing, in a known frequency band, m transmission channels each corresponding to a signal to be sent from the input of at least one transmitting circuit to the output of at least one receiving circuit, where m is an integer greater than or equal to 2 and less than or equal to n, the method comprising the steps of:

numbering said transmission conductors from 1 to n and defining, for any integer j greater than or equal to 1 and less than or equal to n, at any given abscissa along said interconnection, a "natural current" of index j as the current flowing on the transmission conductor number j, and a "natural voltage referenced to the return conductor" of index j as the voltage between the transmission conductor number j and said return conductor;

modeling the interconnection, in a part of said known frequency band, taking into account the lumped impedances seen by the interconnection and caused by the circuits connected to the interconnection elsewhere than at the ends of the interconnection, as a (n+1)-conductor multiconductor transmission line, said multiconductor transmission line having uniform electrical characteristics over its length, said multiconductor transmission line using said natural voltages referenced to the return conductor and said natural currents as variables;

determining, for said multiconductor transmission line and said part of said known frequency band, the characteristic impedance matrix with respect to the return conductor;

coupling the terminals of at least one termination circuit to said return conductor and to each of said transmission conductors, said at least one termination circuit being, in said part of said known frequency band, approximately characterized, for said interconnection, by an impedance matrix with respect to the return conductor (denoted by $Z_{RL}$), said impedance matrix with respect to the return conductor being a matrix of size n×n approximately equal to a diagonal matrix;

using one said transmitting circuit receiving said m signals to be sent, the output of said transmitting circuit being coupled to at least m of said transmission conductors, the output of said transmitting circuit delivering transmission variables to said interconnection; and using one said receiving circuit delivering m "output signals of the receiving circuit" corresponding each to a transmission channel, the input of said receiving circuit being coupled to at least m of said transmission conductors and to said return conductor, each of said "output signals of the receiving circuit" being mainly determined by only one of said natural voltages referenced to the return conductor appearing at the input of said receiving circuit.

Said part of said known frequency band can be any subset of said known frequency band. It is important to clearly distinguish the interconnection, a physical device composed of conductors and insulators, from the model which describes some of its properties, which is here the model of the multiconductor transmission line uniform over its length. This model is not capable of describing all interconnections, but it must be suitable for modeling said interconnection, in said part of said known frequency band, with a sufficient accuracy.

According to the invention, said interconnection is structurally combined with the reference conductor throughout the length of the interconnection. Consequently, if said interconnection is made with a printed circuit board, the reference conductor may be a conductor of the printed circuit board, this conductor being not a part of said interconnection. Consequently, if said interconnection is made with a cable, the reference conductor may be a conductor of the cable (the cable therefore comprises at least n+2 conductors), but the reference conductor is nevertheless not a part of said interconnection.

In particular, said interconnection may be realized without using a cable, for instance an interconnection formed in or on a rigid or flexible printed circuit board (using traces and/or copper areas), or an interconnection formed in or on the substrate of a multi-chip module (MCM) or of an hybrid circuit, or an interconnection formed inside a monolithic integrated circuit.

According to the invention, the return conductor is distinct from the reference conductor. It is therefore important to clarify the concept of distinct conductors, in the framework of the theory of multiconductor transmission lines. In the framework of this theory, a conductor may be made of several sufficiently interconnected conductors. This is for instance the case with the stripline structure well known to the person skilled in the art, in which the reference conductor is made of two ground planes connected the one to the other at many points. By the same token, it is appropriate to treat as a single reference conductor a plurality of conductors between which a low impedance is maintained in said part of said known frequency band, at a sufficient number of points along the direction of propagation. As an example, in a multilayer printed circuit board, the traces of an internal layer, used as transmission conductors, may be routed between a conducting plane used for the ground (ground plane) and a conducting plane connected to a power supply voltage (power plane). The person skilled in the art knows that, if a low impedance is maintained between these conducting planes by a sufficient number of decoupling capacitors connected between these conducting planes and spread over along said internal traces, then the two conducting planes, though at different potentials, behave indeed as a single reference conductor for the propagation of signals at sufficiently high frequencies. The wording "reference conductor" may therefore designate several conductors connected the one to the other at a sufficient number of points along the direction of propagation, through sufficiently low impedances in said part of said known frequency band. The wording "return conductor" may also designate several conductors connected the one to the other at a sufficient number of points along the direction of propagation, through sufficiently low impedances in said part of said known frequency band.

For any integer j greater than or equal to 1 and less than or equal to n, at a given abscissa z along said interconnection, let us use $i_j$ to denote the natural current of index j, that is to say the current flowing on the transmission conductor number j, and let us use $v_{R\,j}$ to denote the natural voltage referenced to the return conductor of index j, that is to say the voltage between the transmission conductor number j and said return conductor. We may define the column-vector $I_R$ of the natural currents $i_1, \ldots, i_n$ and the column-vector $V_R$ of the natural voltages referenced to the return conductor $v_{R\,1}, \ldots, v_{R\,n}$.

According to the invention, the interconnection is modeled as a (n+1)-conductor multiconductor transmission line, with a sufficient accuracy in said part of said known frequency band, taking into account the lumped impedances seen by the interconnection and caused by the circuits connected to the interconnection elsewhere than at the ends of the interconnection. It is clear for the specialist that this implies that all conductors other than the conductors of the interconnection may be neglected when one models propagation in the interconnection and that, in particular, the reference conductor may be neglected when one models propagation in the interconnection. It is consequently possible to define, at each abscissa z along the interconnection, at any frequency f in said part of said known frequency band, a per-unit-length impedance matrix $Z_R$ and a per-unit-length admittance matrix $Y_R$, and the applicable telegrapher's equations are:

$$\begin{cases} \dfrac{dV_R}{dz} = -Z_R I_R \\ \dfrac{dI_R}{dz} = -Y_R V_R \end{cases} \quad (1)$$

The (n+1)-conductor multiconductor transmission line defined by the equation (1) uses said natural voltage referenced to the return conductor and said natural current as variables. $Z_R$ and $Y_R$ are matrices of size n×n, and we write $$Z_R \approx \begin{pmatrix} Z_{R11} & \ldots & Z_{R1n} \\ \vdots & \ddots & \vdots \\ Z_{Rn1} & \ldots & Z_{Rnn} \end{pmatrix} \quad (2)$$

and $$Y_R \approx \begin{pmatrix} Y_{R11} & \ldots & Y_{R1n} \\ \vdots & \ddots & \vdots \\ Y_{Rn1} & \ldots & Y_{Rnn} \end{pmatrix} \quad (3)$$

Of course, the interconnection used in a device implementing the method of the invention may possibly also be modeled as a (n+2)-conductor multiconductor transmission line, said multiconductor transmission line using natural voltages referenced to ground and natural currents as variables. For such a model, the specialist understands that it is necessary to consider, at a given abscissa z along the interconnection:
a) for any integer j greater than or equal to 1 and less than or equal to n, the natural current of index j, denoted by $i_j$;
b) the current flowing on the return conductor, denoted by $i_{n+1}$;
c) for any integer j greater than or equal to 1 and less than or equal to n, the voltage between the transmission conductor number j and said reference conductor, denoted by $v_{G\,j}$;
d) the voltage between said return conductor and said reference conductor, denoted by $v_{G\,n+1}$.

We may then define the column-vector $I_G$ of the currents $i_1, \ldots, i_{n+1}$ and the column-vector $V_G$ of the natural voltages referenced to ground $v_{G\,1}, \ldots, v_{G\,n+1}$. When it is possible to define, at each abscissa z along the interconnection, at any frequency f in said part of said known frequency band, a per-unit-length impedance matrix $Z_G$ and a per-unit-length admittance matrix $Y_G$, the applicable telegrapher's equations are:

$$\begin{cases} \dfrac{dV_G}{dz} = -Z_G I_G \\ \dfrac{dI_G}{dz} = -Y_G V_G \end{cases} \quad (4)$$

In equation (4) the matrices $Z_G$ and $Y_G$ are of size (n+1)×(n+1). We have said above that, according to the invention, the interconnection may be modeled with a sufficient accuracy as a (n+1)-conductor multiconductor transmission line. Consequently, the specialist understands that, in equation (4), we may say that, to a sufficient accuracy:

the $v_{G\,j} - v_{G\,n+1}$ depend only on the $i_1, \ldots, i_n$;

the relationships between the $v_{G\,j} - v_{G\,n+1}$ and the $i_1, \ldots, i_n$ are determined by the matrices $Z_R$ and $Y_R$.

As shown in the article of F. Broydé and E. Clavelier entitled "A new pseudo-differential transmission scheme for on-chip and on-board interconnections" published in the proceedings of the "$14^{\grave{e}me}$ colloque international sur la compatibilitéélectromagnétique—CEM 08", which took place in Paris, France in May 2008, it is then possible to prove that $v_{G\,n+1}$ is independent from any $i_1, \ldots, i_n$ such that $i_1 + \ldots + i_{n+1} = 0$, and that there exist a per-unit-length impedance $Z_{RG}$ and a per-unit-length admittance $Y_{RG}$ such that the matrices $Z_G$ and $Y_G$ are, in said part of said known frequency band, approximately given by $$Z_G \approx \begin{pmatrix} Z_{R11}+Z_{RG} & \ldots & Z_{R1n}+Z_{RG} & Z_{RG} \\ \vdots & \ddots & \vdots & \vdots \\ Z_{Rn1}+Z_{RG} & \ldots & Z_{Rnn}+Z_{RG} & Z_{RG} \\ Z_{RG} & \ldots & Z_{RG} & Z_{RG} \end{pmatrix} \quad (5)$$

and $$Y_G \approx \begin{pmatrix} Y_{R11} & \ldots & Y_{R1n} & -\sum_{i=1}^{n} Y_{R1i} \\ \vdots & \ddots & \vdots & \vdots \\ Y_{Rn1} & \ldots & Y_{Rnn} & -\sum_{i=1}^{n} Y_{Rni} \\ -\sum_{i=1}^{n} Y_{Ri1} & \ldots & -\sum_{i=1}^{n} Y_{Rin} & Y_{RG} + \sum_{i=1}^{n}\sum_{j=1}^{n} Y_{Rij} \end{pmatrix} \quad (6)$$

Let us note that, in the case of the interconnections shown in FIGS. 5 and 6, the specialist may easily check that the matrix $Z_G$ is not in the form of equation (5), and the matrix $Y_G$ is not in the form of equation (6). In the same way, the interconnection used in the sixth embodiment of said French patent number 0300064 and international application number PCT/EP2003/015036, initially described by J. G. Nickel, D. Trainor and J. E. Schutt-Ainé in their paper "Frequency-Domain-Coupled Micro strip-Line Normal-Mode Parameter Extraction From S-Parameters", published in the journal *IEEE Transactions on Electromagnetic Compatibility*, vol. 43, No. 4, November 2001, at the pages 495 to 503, is a microstrip structure comprising 3 conductors above a ground plane, the structure being such that $$Z_G \approx j\omega L_G \text{ with } L_G = \begin{pmatrix} 0.3139 & 0.0675 & 0.0222 \\ 0.0675 & 0.3193 & 0.0675 \\ 0.0222 & 0.0675 & 0.3139 \end{pmatrix} \mu H/m \quad (7)$$

and $$Y_G \approx j\omega C_G \text{ with } C_G = \begin{pmatrix} 130.3 & -16.2 & -0.8 \\ -16.2 & 133.7 & -16.2 \\ -0.8 & -16.2 & 130.3 \end{pmatrix} pF/m \quad (8)$$

where ω is the radian frequency. Since the components of the last row of and of the last column of $L_G$ are not equal, $Z_G$ given by equation (7) cannot satisfy equation (5). Since the sum of the components of the first row (or of the first column) of $C_G$ is not equal to zero, and since the sum of the components of the second row (or of the second column) of $C_G$ is not equal to zero, $Y_G$ given by equation (8) cannot satisfy equation (6). Consequently, the equations (5) and (6) can only be applied to particular interconnections. Consequently, the characteristic "in said part of said known frequency band, said interconnection may be modeled with a sufficient accuracy as a (n+1)-conductor multiconductor transmission line" is a remarkable property of the device implementing the method of the invention.

There are structures in which the transmission conductors are in a way closer to the return conductor than to the reference conductor, and which can be proportioned such that the interconnection may be modeled, with a sufficient accuracy, as a (n+1)-conductor multiconductor transmission line. Examples of such structures will be described in the first embodiment and in the second embodiment.

According to the invention, said multiconductor transmission line has uniform electrical characteristics over its length, said multiconductor transmission line using said natural voltages referenced to the return conductor and said natural currents as variables. Consequently, the per-unit-length impedance matrix $Z_R$ and the per-unit-length admittance matrix $Y_R$ are independent from the abscissa z, and the equation (1) implies that the classical results concerning uniform multiconductor transmission lines may be transposed. In particular, the specialist understands that the transposition of said articles of F. Broydé and E. Clavelier published in 2005 and 2006 provides, in said part of said known frequency band, the following results:

it is possible to compute a characteristic impedance matrix with respect to the return conductor, denoted by $Z_{RC}$, as from $Z_R$ and $Y_R$;

if, as said above, we use $Z_{RL}$ to denote said impedance matrix of a termination circuit with respect to the return conductor, $Z_{RL}$ is, according to the invention, a matrix of size n×n, and the matrix of the voltage reflection coefficients of the termination circuit with respect to the return conductor, denoted by $P_R$, is given by $$P_R = (Z_{RL} - Z_{RC})(Z_{RL} + Z_{RC})^{-1} \quad (9)$$

a termination circuit such that $Z_{RL}$ is a diagonal matrix may for instance be made of n linear two-terminal circuit elements, each linear two-terminal circuit element having a terminal connected to a transmission conductor and a terminal connected to the return conductor, the n linear two-terminal circuit elements being easily proportioned such that all components of the matrix $P_R$ have an absolute value less than a sufficiently small arbitrary value, for instance ⁶⁄₁₀;

it is even possible to determine a termination circuit presenting a diagonal matrix $Z_{RL}$ minimizing the detrimental effects of reflections, by minimizing a suitable norm of $P_R$.

Consequently, according to the invention, it is possible that, in said part of said known frequency band, each component of the matrix $P_R$ of the voltage reflection coefficients, with respect to the return conductor, of at least one said termination circuit, has an absolute value less than or equal to ⁶⁄₁₀.

Consequently, according to the invention, it is possible that, in said part of said known frequency band, the impedance matrix $Z_{RL}$, with respect to the return conductor, of at least one said termination circuit, is approximately equal to a diagonal matrix minimizing a matrix norm of the matrix $P_R$ of the voltage reflection coefficients, with respect to the return conductor, of said at least one said termination circuit.

The computation methods suitable for the synthesis of a termination circuit minimizing such a norm are well known to specialists. However, we must note that equation (9) is an equality between matrices of size n×n, concerning a termination circuit which may be made of n linear two-terminal circuit elements having a terminal connected to the return conductor (these linear two-terminal circuit elements are not connected to the reference conductor), whereas the theory presented in said articles of F. Broydé and E. Clavelier published in 2005 and 2006 relates to an equality between matrices of size (n+1)×(n+1), concerning a termination circuit made of n+1 linear two-terminal circuit elements having a terminal connected to the reference conductor.

The specialists know, for instance from a computation based on the geometry of the conductors and insulators, on the conductivity of the conductors and on the permittivity and the losses of the insulators, how to determine the matrices $Z_G$ and $Y_G$ of a multiconductor transmission line, as a function of frequency. The specialists also know how to measure these matrices. It is therefore clear that it is possible to proportion the conductors of a suitable structure such that:

the equations (5) and (6) are satisfied to a sufficient accuracy in said part of said known frequency band;

the matrices $Z_R$ and $Y_R$ obtained from the equations (5) and (6) are independent of z;

one obtains a matrix $Z_{RC}$ approximating a wanted matrix.

Consequently, the method of the invention may be such that, prior to modeling the interconnection, one proportions said interconnection in such a way that it may, with a sufficient accuracy in said part of said known frequency band, taking into account the lumped impedances seen by the interconnection and caused by the circuits connected to the interconnection elsewhere than at the ends of the interconnection, be modeled as a multiconductor transmission line having n+1 conductors, said multiconductor transmission line having uniform electrical characteristics over its length, said multiconductor transmission line using said natural voltages referenced to the return conductor and said natural currents as variables.

We now describe a device for implementing the method of the invention. A device for transmission providing, in a known frequency band, m transmission channels each corresponding to a signal to be sent from the input of at least one transmitting circuit to the output of at least one receiving circuit, where m is an integer greater than or equal to 2, comprises:

an interconnection having n transmission conductors and a return conductor distinct from the reference conductor, n being an integer greater than or equal to m, the interconnection being structurally combined with the reference conductor throughout the length of the interconnection, the interconnection being such that the interconnection can be modeled, in a part of said known frequency band, taking into account the lumped impedances seen by the interconnection and caused by the circuits connected to the interconnection elsewhere than at the ends of the interconnection, as a (n+1)-conductor multiconductor transmission line, said multiconductor transmission line having uniform electrical characteristics over its length, said multiconductor transmission line using the natural voltages referenced to the return conductor and the natural currents as variables;

at least one said transmitting circuit receiving said m signals to be sent, the output of said at least one said transmitting circuit being coupled to at least m of said transmission conductors;

at least one said receiving circuit delivering, when said at least one said receiving circuit is in the activated state, m "output signals of the receiving circuit" corresponding each to a transmission channel, the input of said at least one said receiving circuit being coupled to at least m of said transmission conductors and to said return conductor, each of said "output signals of the receiving circuit" being mainly determined by only one of said natural voltages referenced to the return conductor; and at least one termination circuit coupled to said return conductor and to each of said transmission conductors, said at least one termination circuit being, in said part of said known frequency band, when said at least one termination circuit is in the activated state, approximately characterized, for said interconnection, by an impedance matrix $Z_{RL}$ with respect to the return conductor, said impedance matrix with respect to the return conductor being a matrix of size n×n approximately equal to a diagonal matrix, said at least one termination circuit being, in said part of said known frequency band, when said at least one termination circuit is in the activated state, such that each component of the matrix $P_R$ of the voltage reflection coefficients, with respect to the return conductor, of said at least one termination circuit, has an absolute value less than or equal to $6/10$.

According to the invention, it is possible that there is a deactivated state for one or more of said receiving circuits, in which the behavior of this receiving circuit is different from the one defined above. However, the existence of a deactivated state for one or more of said receiving circuits is not at all a characteristic of the invention. According to the invention, it is possible that there is a deactivated state for one or more of said termination circuits, in which the behavior of this termination circuit is different from the one defined above. However, the existence of a deactivated state for one or more of said termination circuits is not at all a characteristic of the invention.

In a device for implementing the method of the invention, said interconnection may in particular be realized without using a cable, as explained above.

In a device for implementing the method of the invention, it is possible that the number m of transmission channels between one of said transmitting circuits and one of said receiving circuits is equal to the number n of transmission conductors. In the opposite case, n>m, and the transmission conductors which are not allocated to a transmission channel may have another function, for instance the transmission of reference or power feeding voltages, or of address or control signals. In particular, n may be greater than or equal to three.

In a device for implementing the method of the invention, it is possible that each of said termination circuits is arranged at an end of said interconnection. This arrangement is preferred because specialists understand that the best technique for eliminating reflections consists in arranging, at least one end of the interconnection, a termination circuit such that the impedance matrix of the termination circuit with respect to the return conductor approximates a diagonal matrix minimizing the detrimental effects of reflections. However, a termination circuit is sometimes arranged elsewhere than at an end of the interconnection, as explained in sections 6.1.3 and 6.3 of chapter 6 of the above-mentioned book of H. W. Johnson and M. Graham and as shown in FIG. 4c of said patent of the United States of America U.S. Pat. No. 6,195,395.

A device of the invention may be such that said termination circuits, said transmitting circuits and said receiving circuits are without any part in common to any two of them. Conversely, a device of the invention may be such that said termination circuits, said transmitting circuits and said receiving circuits are not without any part in common to any two of them.

The method and the device of the invention, thanks to the characteristics specified for the interconnection and for the terminations, use the return conductor as a return path for the return current produced by the currents flowing in the n transmission conductors, hence the name "return conductor". This is not the case for the common conductor used in the FIGS. 3 and 4. However, the return conductor as defined in the invention and the common conductor of prior art share the property of being used by the receiving circuits for delivering the "output signals of the receiving circuit". Consequently, it is appropriate to consider that the method and the device of the invention are pseudo-differential.

According to the invention, it is specified that it must be possible to model the interconnection as a multiconductor transmission line having uniform electrical characteristics over its length in said part of said known frequency band, taking into account the lumped impedances seen by the interconnection and caused by the circuits connected to it elsewhere than at its ends. In order to take these lumped impedances into account by merely stating that they are not present or that they may be ignored, these circuits must be such that they do not disturb the propagation along the multiconductor transmission line. The person skilled in the art sees that this result can for instance be obtained by:

using transmitting circuits and/or receiving circuits connected in series with the conductors of the interconnection, and showing a low series impedance, using transmitting circuits and/or receiving circuits connected in parallel with the conductors of the interconnection, and showing a high parallel impedance.

Connecting the receiving circuits and the transmitting circuits in parallel with the interconnection is simpler than connecting them in series. The parallel connection is therefore a priori preferred.

According to the invention, it is possible that the section of the interconnection in a plane orthogonal to the direction of propagation does not change, except for a scale factor, over the greatest part of the length of the interconnection, in the vicinity of the transmission conductors.

A device for implementing the method of the invention may preferentially be such that said known frequency band contains frequencies ranging between 100 kHz and 100 GHz. It is often possible, for instance for frequencies greater than 1 MHz, to obtain a practically real and frequency-independent matrix $Z_{RC}$. In this case, it is clear for the person skilled in the art that a termination circuit presenting a diagonal matrix $Z_{RL}$ minimizing the detrimental effects of reflections at such frequencies could for instance be made of a network of n resistors connected to the return conductor, and that the computations needed to proportion this network may be based on equation (9).

One or more of said termination circuits of a device of the invention may for instance be a termination circuit defined in said French patent application Ser. No. 07/04421 and said international application number PCT/IB2008/051826, having n signal terminals and a common terminal, each of said signal terminals being connected to one and only one of said transmission conductors, each of said transmission conductors being connected to one and only one of said signal terminals, said common terminal being connected to said return conductor. Consequently, as shown in FIG. 14, a device of the invention may be such that at least one said termination circuit is, when said at least one said termination circuit is in the activated state, approximately equivalent, for said transmission conductors and said return conductor, to a network consisting of n branches, each of said branches having a first terminal and a second terminal, each of said branches consisting of a passive linear two-terminal circuit element (441) (442) (443) (444) connected in series with a voltage source (431) (432) (433) (434) delivering a constant voltage, the first terminal of each of said branches being connected to one and only one of said transmission conductors (11) (12) (13) (14), the second terminal of each of said branches being connected to said return conductor (10), each of said transmission conductors being connected to said first terminal of one and only one of said branches. Such a termination circuit in the activated state presents, with respect to said return conductor, at any frequency, a diagonal impedance matrix of size n×n.

A device of the invention may be such that at least one said termination circuit is made of a network of n resistors, each of said resistors being connected between one of said transmission conductors and said return conductor, each of said resistors being connected to a different transmission conductor.

A termination circuit made of a network of resistors is however not at all a characteristic of the invention. By way of a first example, designers may, in order to reduce the power consumed by one of said termination circuits, choose to allow this termination circuit to be effective only in a relevant interval of frequencies, for instance by including suitable reactive circuit elements in this termination circuit. By way of a second example, one of said termination circuits could include active components, for instance insulated gate field-effect transistors (MOSFETs) operating in the ohmic regime. The impedance of the channel of such components may be adjustable by electrical means. Consequently, a device of the invention may be such that the impedance matrix $Z_{RL}$ with respect to the return conductor, of at least one said termination circuit in the activated state, can be adjusted by electrical means.

In the case where one of said termination circuits has an activated state and a deactivated state, the impedance of the channel of one or more MOSFETs may for instance be controlled by one or more control signals taking on different values in the activated state and in the deactivated state. Consequently, at least one of said termination circuits may be such that said termination circuit has an activated state and a deactivated state, the impedance matrix, with respect to said return conductor, of said termination circuit in the activated state being different from the impedance matrix, with respect to said return conductor, of said termination circuit in the deactivated state.

In the case where one of said termination circuits has an activated state and a deactivated state, components such as transistors may for instance be used as switches having a closed state and an open state. In this case, said transistors may for instance be in the closed state when this termination circuit is in the activated state, and be in the open state when this termination circuit is in the deactivated state. Consequently, it is possible that at least one said termination circuit has an activated state and a deactivated state, each current flowing from said at least one said termination circuit to one of said transmission conductors being substantially zero when said at least one said termination circuit is in the deactivated state. Designers may, in order to reduce the power consumed by such a termination circuit, choose to put this termination circuit in the deactivated state when a transmitting circuit close to the termination circuit is in the activated state. Such a termination circuit may for instance use one of the principles shown in FIGS. 10 and 11 of said French patent application Ser. No. 07/04421 and said international application number PCT/IB2008/051826.

According to the invention, at least one termination circuit is such that $Z_{RL}$ is a matrix of size n×n. This implies that this termination circuit in the activated state behaves, for the interconnection, as if it was not connected to said reference conductor. However, a device of the invention may further comprise, as shown in FIG. 15, one or more damping circuits coupled to said return conductor, each of said damping circuits (8) being, for said return conductor, approximately equivalent to a network consisting of a passive two-terminal circuit element (83) and a voltage source delivering a constant voltage (84), the passive two-terminal circuit element having a first terminal connected to said return conductor (10), the passive two-terminal circuit element having a second terminal connected to the first terminal of the voltage source, the second terminal of the voltage source being connected to said reference conductor (ground). Since the invention does not use signals applied between the common conductor and ground, the function of said damping circuits is not to reduce the reflections of signals. The specialist understands that said damping circuits are intended to provide a damping of the resonances of the circuit consisting of the return conductor and the reference conductor, which may be excited by the noise produced by unwanted electromagnetic couplings. Said damping circuits may therefore further reduce the effects of unwanted electromagnetic couplings.

Any one of said damping circuits may be such that said passive two-terminal circuit element belonging to said network approximately equivalent to said damping circuit may be considered as linear. Consequently, according to the invention, at least one of said damping circuits may be, for said return conductor, approximately equivalent to a network consisting of a passive linear two-terminal circuit element having a first terminal coupled to said return conductor and a second terminal held at a (positive, negative or zero) fixed voltage with respect to said reference conductor. Such a damping circuit is characterized, at any non-zero frequency, by a scalar impedance.

It is important to observe that the combination of such a damping circuit and of one of said termination circuits presents, with respect to said return conductor, at any given frequency, a diagonal impedance matrix of size (n+1)×(n+1). This characteristic does not apply to prior art terminations of FIGS. 3 and 4.

A device of the invention may be such that none of said damping circuits has any part in common with one of said receiving circuit and/or with one of said termination circuit and/or with one of said transmitting circuit. Conversely, a device of the invention may be such that one or more of said damping circuits has one or more parts in common with one of said receiving circuit and/or with one of said termination circuit and/or with one of said transmitting circuit.

One or more of said transmitting circuits of a device of the invention may for instance be a device described in the French patent application Ser. No. 07/04889 of 6 Jul. 2007, entitled "Dispositif d'interface pseudo-différentiel avec circuit d'equilibrage" and in the international application number PCT/IB2008/051942 of 16 May 2008, entitled "Pseudo-differential interfacing device having a balancing circuit", having n signal terminals and a common terminal, each of said signal terminals being connected to one and only one of said transmission conductors, each of said transmission conductors being connected to one and only one of said signal terminals, said common terminal being connected to said return conductor.

One said transmitting circuit and one said receiving circuit of a device of the invention may for instance make a device described in the French patent application Ser. No. 07/04949 of 9 Jul. 2007, entitled "Dispositif d'interface pseudo-différentiel avec circuit de commutation" and in the international application number PCT/IB2008/051982 of 20 May 2008, entitled "Pseudo-differential interfacing device having a switching circuit", having n signal terminals and a common terminal, each of said signal terminals being connected to one and only one of said transmission conductors, each of said transmission conductors being connected to one and only one of said signal terminals, said common terminal being connected to said return conductor.

According to the invention, one or more of said transmitting circuits and/or one or more of said receiving circuits may have a filtering function, for instance for the purpose of obtaining a pre-emphasis, a de-emphasis or an equalization improving transmission. It then becomes necessary to synthesize the corresponding filters, either as analog filters or as digital filters, using one of the many methods known to specialists.

When losses are not negligible in the interconnection, phase and amplitude distortions may occur, which are referred to as distortions caused by propagation. The reduction of these distortions may be obtained, in a device of the invention, using an equalization reducing the effects of the distortions caused by propagation, said equalization being implemented in one or more of said transmitting circuits and/or in one or more of said receiving circuits. This type of processing, which is also sometimes referred to as compensation, is well known to specialists, and may be implemented using analog signal processing or digital signal processing. Specialists know that it is commonplace to use adaptive algorithms for implementing this type of processing in receivers for data transmission. A device of the invention may use an adaptive equalization. This type of processing is well known to specialists, and is often implemented using digital signal processing.

BRIEF DESCRIPTION OF THE DRAWINGS

Other advantages and characteristics of the invention will appear more clearly from the following description of particular embodiments of the invention, given by way of non-limiting examples, with reference to the accompanying drawings in which.

DETAILED DESCRIPTION OF SOME EMBODIMENTS

First Embodiment

Figure 7:
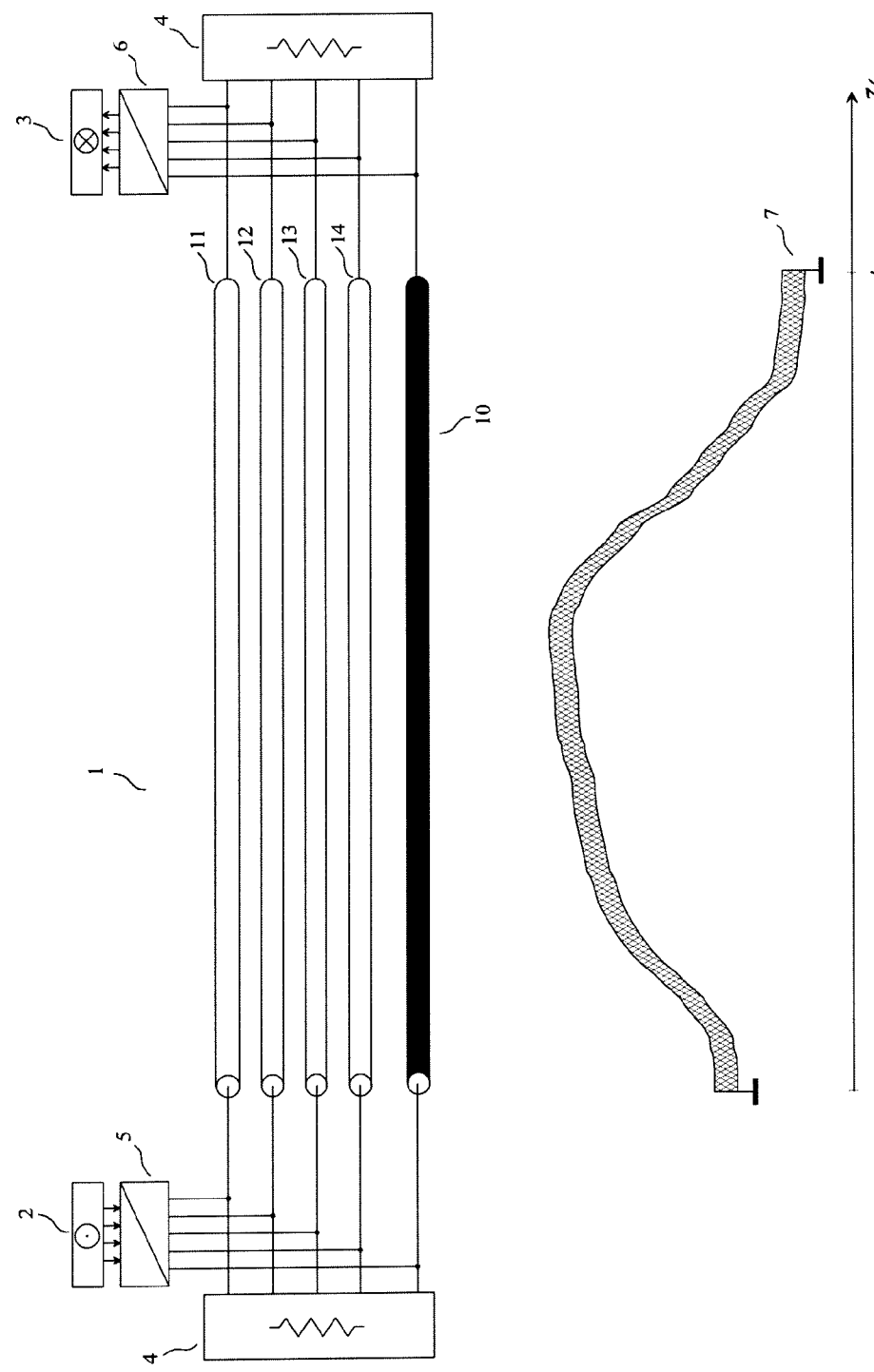
FIG. 7 shows a first embodiment and a second embodiment.

As a first embodiment of a device for implementing the method of the invention, given by way of non-limiting example, we have represented in FIG. 7 a device of the invention comprising an interconnection (1) having n=4 transmission conductors (11) (12) (13) (14) and a return conductor (10) distinct from the reference conductor (7). The two termination circuits (4) are connected to the conductors (10) (11) (12) (13) (14) of the interconnection (1), the impedance matrix of each termination circuit with respect to the return conductor being approximately equal, in a part of a known frequency band used for transmission, to a diagonal matrix of size n×n minimizing a matrix norm of the matrix of the voltage reflection coefficients of the termination circuit with respect to the return conductor. The transmitting circuit (5) receives at its input the signals of the 4 channels of the source (2), and its n+1=5 output terminals are connected to the conductors (10) (11) (12) (13) (14) of the interconnection (1). The receiving circuit (6) has its n+1=5 input terminals connected to the conductors (10) (11) (12) (13) (14) of the interconnection (1). The output of the receiving circuit (6) delivers 4 "output signals of the receiving circuit" to the destination (3). Thus, the analog or digital signals of the four channels of the source (2) are sent to the four channels of the destination (3).

The transmitting circuit (5) is a "Pseudo-differential interfacing device having a balancing circuit" according to said French patent application Ser. No. 07/04889 and international application number PCT/IB2008/051942, which produces natural currents at its output (the transmission variables are therefore natural currents), each of these natural currents being mainly determined by the signal of only one channel of the source (2). Each of said "output signals of the receiving circuit" delivered by the receiving circuit (6) is mainly determined by only one of the natural voltages referenced to the return conductor.

Figure 1:
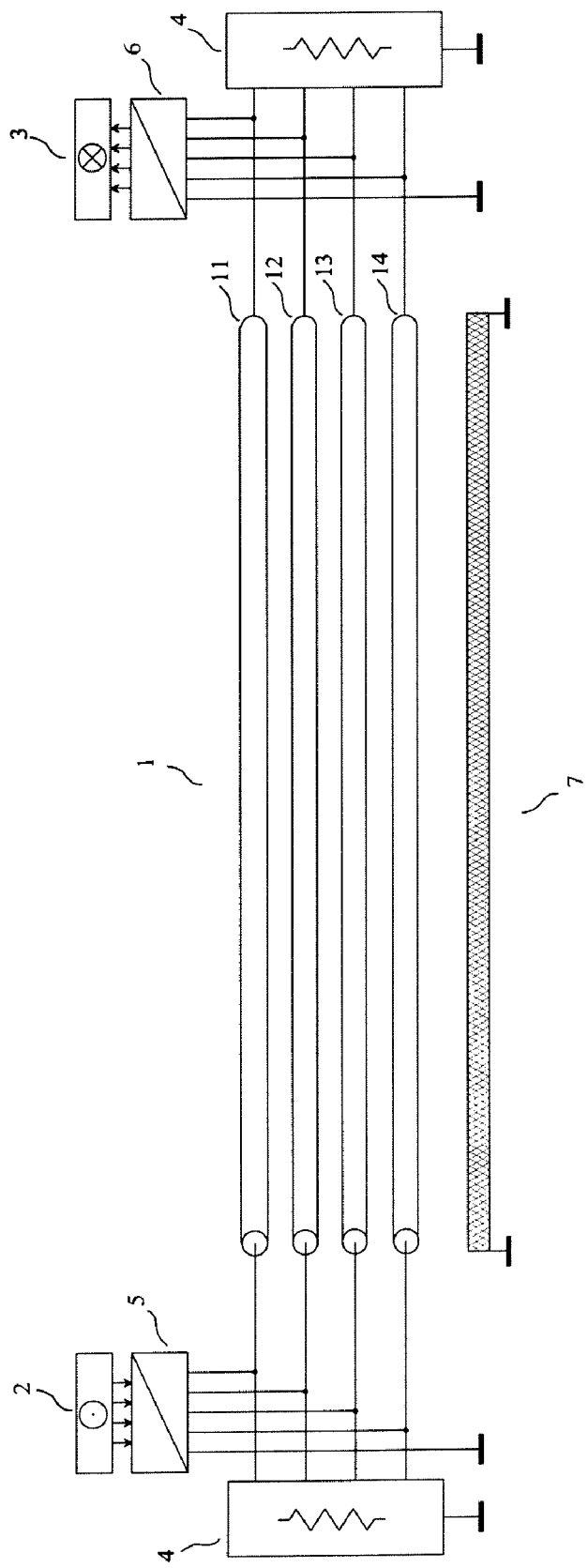
FIG. 1 shows a device for transmission comprising an interconnection having four transmission conductors, and has already been discussed in the section dedicated to the presentation of prior art.
Figure 2:
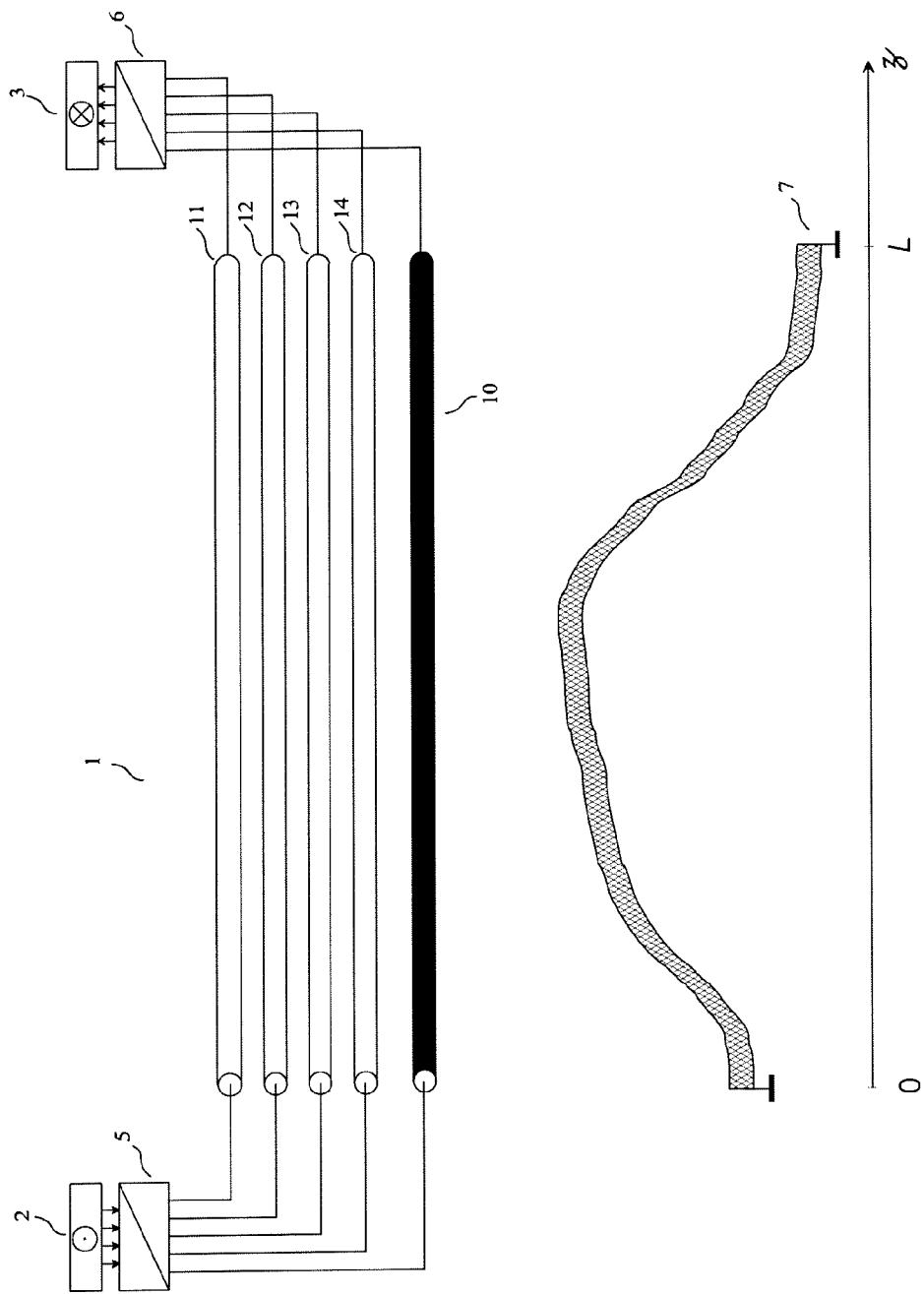
FIG. 2 shows a first pseudo-differential device for transmission comprising an interconnection having four transmission conductors, and has already been discussed in the section dedicated to the presentation of prior art.
Figure 3:
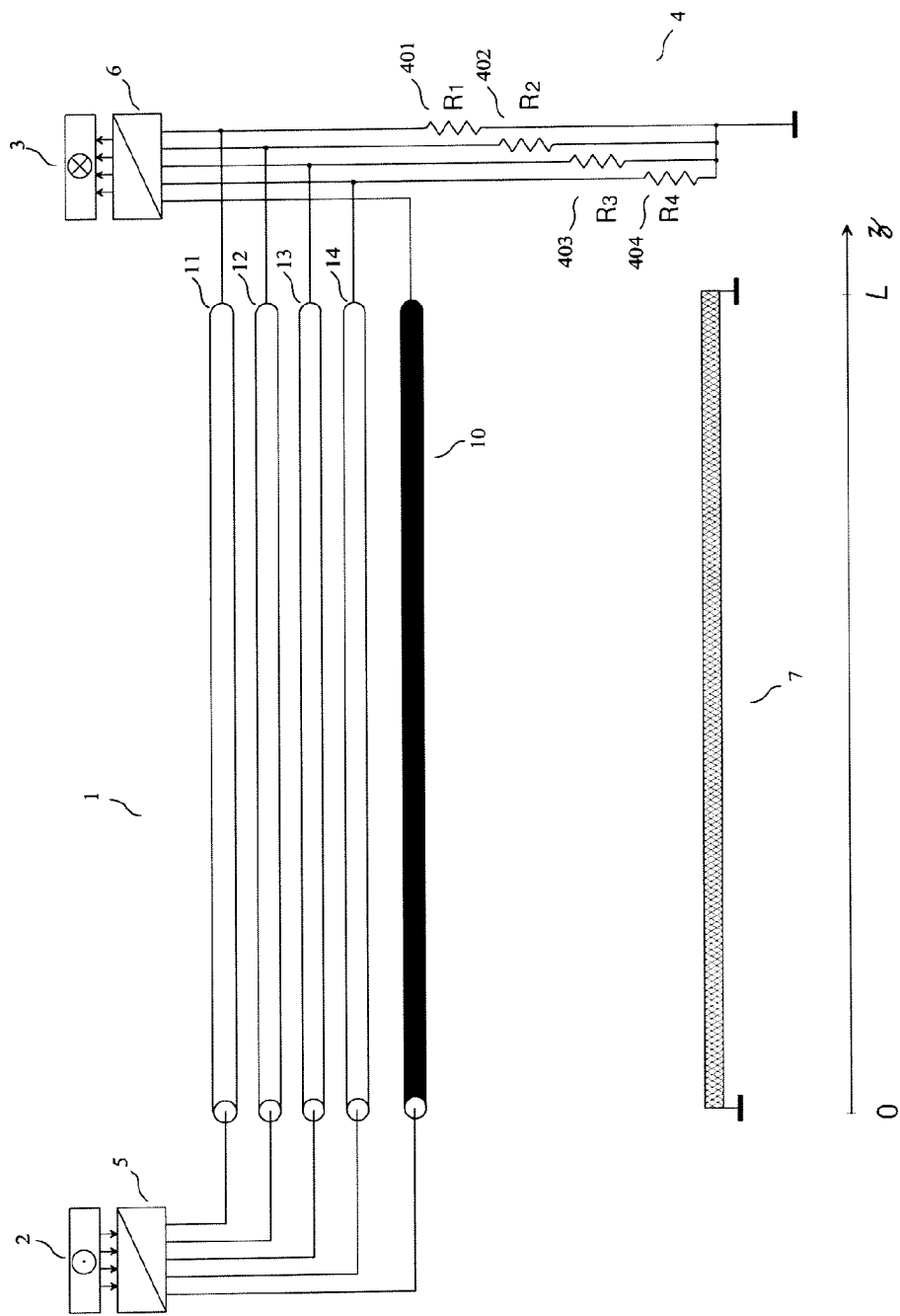
FIG. 3 shows a second pseudo-differential device for transmission comprising an interconnection having four transmission conductors, and has already been discussed in the section dedicated to the presentation of prior art.

The specialist sees that, for the prior art pseudo-differential system for transmission shown in FIG. 3:

the termination (4) does not have an impedance matrix with respect to the common conductor;

the termination (4) has an impedance matrix $Z_{G1}$ with respect to the reference conductor.

The impedance matrix $Z_{G1}$ is a diagonal matrix of size 4×4 equal to $$Z_{G1} = \begin{pmatrix} R_1 & 0 & 0 & 0 \\ 0 & R_2 & 0 & 0 \\ 0 & 0 & R_3 & 0 \\ 0 & 0 & 0 & R_4 \end{pmatrix} \quad (10)$$

where we have used the notations of FIG. 3 and a suitable numbering of the transmission conductors. The specialist sees that, for the prior art pseudo-differential system for transmission shown in FIG. 4:

the termination (4) has an impedance matrix $Z_{C2}$ with respect to the common conductor;

the termination (4) has an impedance matrix $Z_{G2}$ with respect to the reference conductor.

Figure 4:
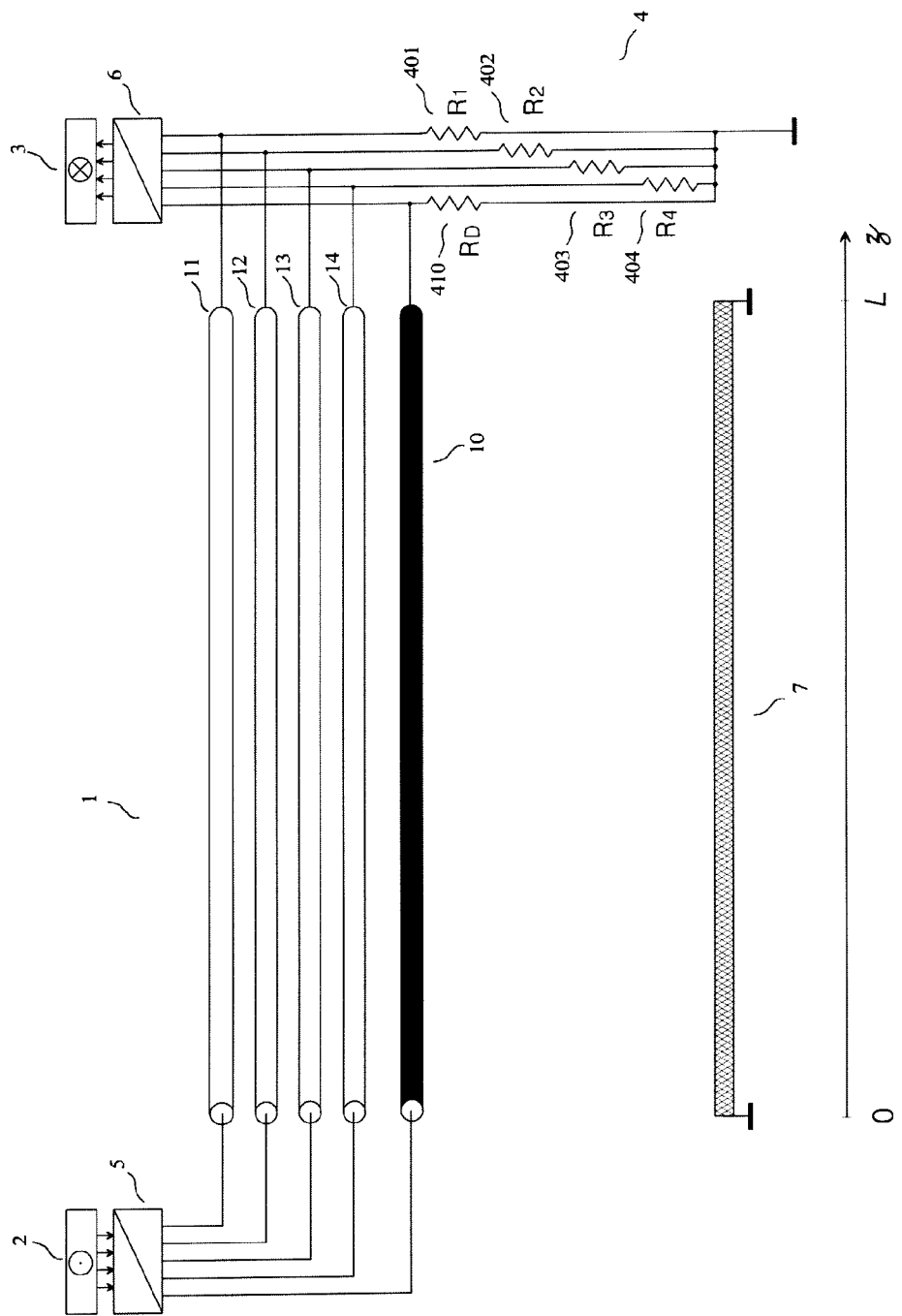
FIG. 4 shows a third pseudo-differential device for transmission comprising an interconnection having four transmission conductors, and has already been discussed in the section dedicated to the presentation of prior art.
Figure 5:
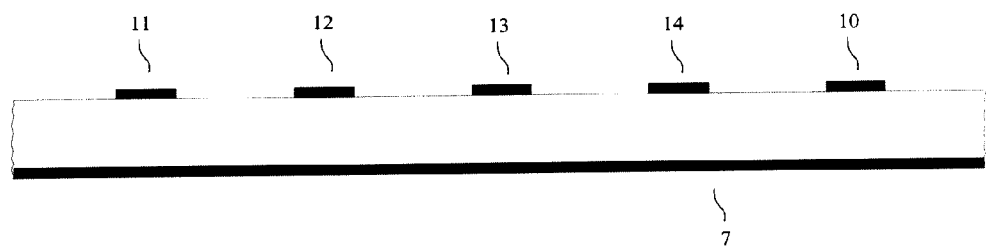
FIG. 5 shows a cross section of an interconnection and of the reference conductor, which may be used in the pseudo-differential devices for transmission of the FIGS. 3 and 4.
Figure 6:
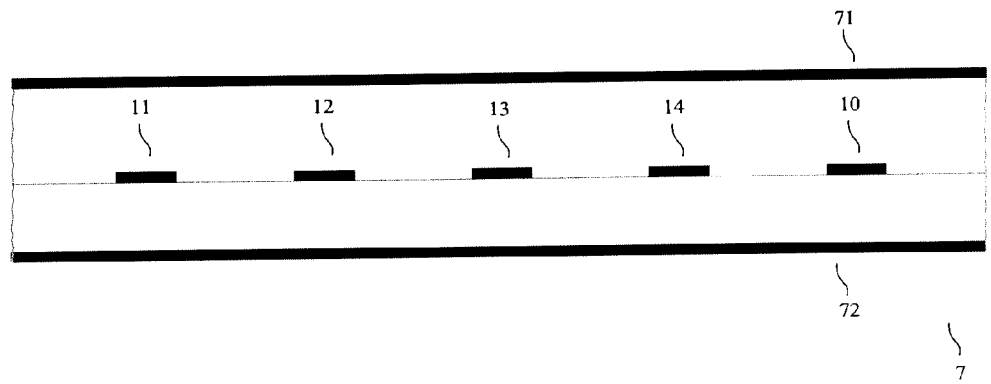
FIG. 6 shows a cross section of an interconnection and of the reference conductor, which may be used in the pseudo-differential devices for transmission of the FIGS. 3 and 4.

The impedance matrices $Z_{C2}$ and $Z_{G2}$ are square matrices of size 5×5 equal to $$Z_{C2} = \begin{pmatrix} R_1+R_D & R_D & R_D & R_D & R_D \\ R_D & R_2+R_D & R_D & R_D & R_D \\ R_D & R_D & R_3+R_D & R_D & R_D \\ R_D & R_D & R_D & R_4+R_D & R_D \\ R_D & R_D & R_D & R_D & R_D \end{pmatrix} \quad (11)$$

and $$Z_{G2} = \begin{pmatrix} R_1 & 0 & 0 & 0 & 0 \\ 0 & R_2 & 0 & 0 & 0 \\ 0 & 0 & R_3 & 0 & 0 \\ 0 & 0 & 0 & R_4 & 0 \\ 0 & 0 & 0 & 0 & R_D \end{pmatrix} \quad (12)$$

where we have used the notations of FIG. 4 and a suitable numbering of the conductors. The impedance matrix $Z_{G2}$ with respect to the reference conductor is diagonal whereas the impedance matrix $Z_{C2}$ with respect to the common conductor is not a diagonal matrix, since a pseudo-differential system for transmission requires $R_D \neq 0$.

The termination circuits (4) of FIG. 7 are such that the impedance matrix of each termination circuit with respect to the return conductor is approximately equal, in said part of said known frequency band, to a diagonal matrix of size n×n. This characteristic does not apply to prior art terminations for which, at any given frequency:

it is not possible to define an impedance matrix with respect to the return conductor (referred to as common conductor) for the termination (4) of FIG. 3, consisting of n=4 resistors (401) (402) (403) (404);

it is possible to define an impedance matrix $Z_{C2}$ with respect to the return conductor (referred to as common conductor) for the termination (4) of FIG. 4, consisting of n+1=5 resistors (401) (402) (403) (404) (410), but the equation (11) shows that this square matrix of size (n+1)×(n+1) is not diagonal, because, for pseudo-differential transmission, $R_D \neq 0$.

In FIG. 7, in said part of said known frequency band, the specialist understands that each termination circuit (4) behaves as if it was not connected to ground. Consequently, there is no constraint on the manner of routing the interconnection (1) with respect to ground (7). Consequently, in FIG. 7, the reference conductor (7) is represented as an irregular geometrical shape, which indicates that the distance between the conductors of the interconnection (1) and the reference conductor (7) may vary as a function of the abscissa z along the interconnection.

Figure 8:
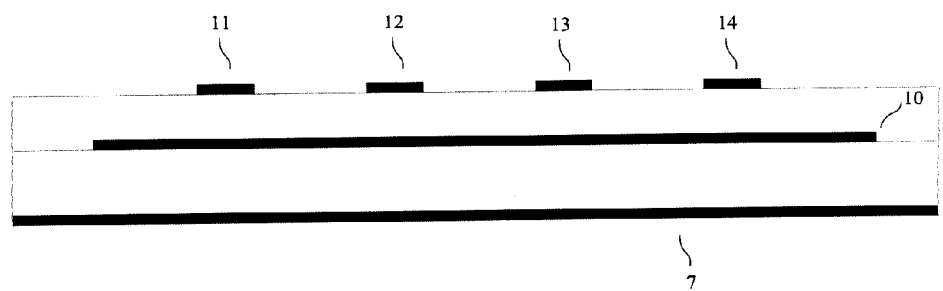
FIG. 8 shows a cross section of an interconnection and of the reference conductor, for the first embodiment.

The interconnection (1) is built in a printed circuit board, the transmission conductors being traces of width equal to about 203 µm. The FIG. 8 shows a section of the interconnection and of the reference conductor (7) in a plane orthogonal to the direction of propagation, at a given abscissa z. In this structure, the return conductor (10) is a copper area and the transmission conductors (11) (12) (13) (14) are traces which are clearly closer to the return conductor (10) than to the reference conductor (7). The interconnection is proportioned in such a way that it can be modeled, with a sufficient accuracy, as a (n+1)-conductor multiconductor transmission line, such that $$Z_R \approx j\omega L_R \text{ with } L_R \approx \begin{pmatrix} 334 & 0 & 0 & 0 \\ 0 & 334 & 0 & 0 \\ 0 & 0 & 334 & 0 \\ 0 & 0 & 0 & 334 \end{pmatrix} \text{nH/m} \quad (13)$$

and $$Y_R \approx j\omega C_R \text{ with } C_R \approx \begin{pmatrix} 107 & 0 & 0 & 0 \\ 0 & 107 & 0 & 0 \\ 0 & 0 & 107 & 0 \\ 0 & 0 & 0 & 107 \end{pmatrix} \text{pF/m} \quad (14)$$

The equations (13) and (14) are applicable to:

a frequency band above 3 MHz, corresponding to said part of said known frequency band, in which the designer has established that losses may be neglected in the computation of the characteristic impedance matrix with respect to the return conductor $Z_{RC}$;

transmission conductors (11) (12) (13) (14) sufficiently spaced to lead the designer to assume that the mutual inductances and the mutual capacitances between the transmission conductors may be neglected.

The interconnection (1) is therefore such that said per-unit-length impedance matrix $Z_R$ and said per-unit-length admittance matrix $Y_R$ are independent of the abscissa z, and such that the characteristic impedance matrix with respect to the return conductor $Z_{RC}$ is given by $$Z_{RC} \approx \begin{pmatrix} 55.9 & 0.0 & 0.0 & 0.0 \\ 0.0 & 55.9 & 0.0 & 0.0 \\ 0.0 & 0.0 & 55.9 & 0.0 \\ 0.0 & 0.0 & 0.0 & 55.9 \end{pmatrix} \Omega \quad (15)$$

Consequently, the termination circuits (4) of the FIG. 7 may clearly be made of n=4 resistors of about 56Ω, each of these resistors being connected between one of the transmission conductors (11) (12) (13) (14) and the return conductor (10). In this manner, the impedance matrix of each termination circuit with respect to the return conductor is approximately equal, in said part of said known frequency band, to a diagonal matrix of size n×n minimizing a matrix norm of the matrix of the voltage reflection coefficients of the termination circuit with respect to the return conductor, since the equation (9) gives $P_R \approx 0$.

At frequencies for which the equations (5) and (6) may be used, it is possible, at any abscissa z, to define the per-unit-length impedance $Z_{RG}$ and the per-unit-length admittance $Y_{RG}$ used in the equations (5) and (6). The fact that, as explained above, there is no constraint on the manner of routing the interconnection (1) with respect to ground (7), implies that $Z_{RG}$ and $Y_{RG}$ a priori depend on the abscissa z. This implies that it is a priori not possible to model the propagation in the interconnection-ground structure using a (n+2)-conductor multiconductor transmission line, said multiconductor transmission line having uniform electrical characteristics over its length.

For the specialist, FIG. 8 shows that the position of the transmission conductors (11) (12) (13) (14) with respect to the return conductor (10) and to the reference conductor (7) is such that the return conductor (10) may in a way act as an electromagnetic screen. Consequently, the currents flowing in the reference conductor (7) will induce, in each of the transmission conductors, a practically zero natural voltages referenced to the return conductor. Consequently, it will be possible to practically eliminate the external crosstalk, using a principle different from the one presented above in the section on prior art. The specialist sees that, according to the invention, there is no contradiction between an effective protection against external crosstalk, which implies that the transmission conductors are in a way closer to the return conductor (10) than to the reference conductor (7), and reduced reflections.

An interconnection having the structure shown in FIG. 8 could also be built inside an integrated circuit, and be used in a device of the invention designed using an approach similar to the one presented in this first embodiment.

Second Embodiment

The second embodiment of a device for implementing the method of the invention, given by way of non-limiting example, also corresponds to the device of the invention shown in FIG. 7, and the explanations relating to FIG. 7 given in the presentation of the first embodiment are applicable to this second embodiment, except that, in this second embodiment, the transmitting circuit (5) is a "Pseudo-differential interfacing device having a balancing circuit" according to said French patent application Ser. No. 07/04889 and international application number PCT/IB2008/051942, which produces natural voltages referenced to the return conductor at its output (the transmission variables are therefore natural voltages referenced to the return conductor), each of these natural voltages referenced to the return conductor being mainly determined by the signal of only one channel of the source (2). The FIG. 8 is not applicable to this second embodiment.

Figure 9:
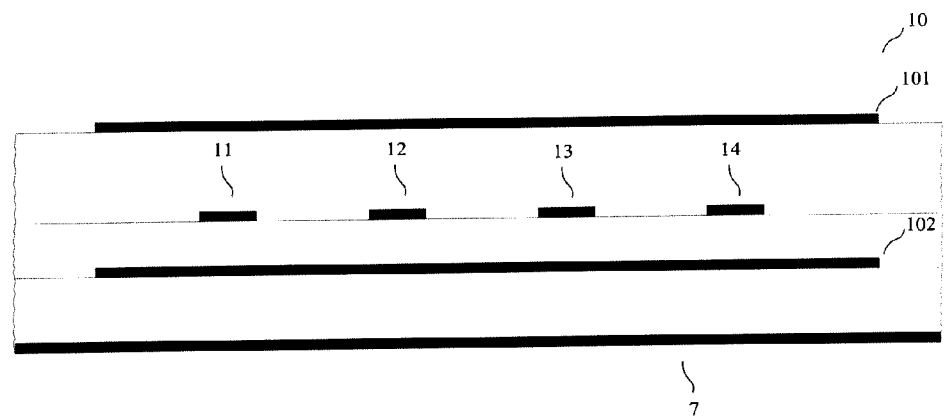
FIG. 9 shows a cross section of an interconnection and of the reference conductor, for the second embodiment.

The interconnection (1) is built in a printed circuit board, using the high-density interconnection technology, the transmission conductors being traces of width equal to about 30 µm with a trace-to-trace spacing of about 40 µm. The FIG. 9 shows a section of the interconnection and of the reference conductor (7) in a plane orthogonal to the direction of propagation, at a given abscissa z. In this structure, the return conductor (10) is made of two interconnected copper areas (101) (102), and the transmission conductors (11) (12) (13) (14) are traces which are clearly closer to the return conductor (10) than to the reference conductor (7). The interconnection is proportioned in such a way that it can be modeled, with a sufficient accuracy, as a (n+1)-conductor multiconductor transmission line, such that $$Z_R \approx j\omega L_R \text{ with} \quad (16)$$

$$L_R \approx \begin{pmatrix} 305.714 & 24.944 & 2.129 & 0.182 \\ 24.944 & 304.731 & 24.861 & 2.129 \\ 2.129 & 24.861 & 304.731 & 24.944 \\ 0.182 & 2.129 & 24.944 & 305.714 \end{pmatrix} \text{nH/m}$$

and $$Y_R \approx j\omega C_R \text{ with} \quad (17)$$

$$C_R \approx \begin{pmatrix} 102.591 & -8.395 & -0.032 & 0.000 \\ -8.395 & 103.607 & -8.391 & -0.032 \\ -0.032 & -8.391 & 103.607 & -8.395 \\ 0.000 & -0.032 & -8.395 & 102.591 \end{pmatrix} \text{pF/m}$$

The equations (16) and (17) are applicable to a frequency band above 50 MHz, corresponding to a part of the known frequency band used for transmission in which the designer has established that losses may be neglected in the computation of the characteristic impedance matrix with respect to the return conductor $Z_{RC}$.

The interconnection (1) is therefore such that said per-unit-length impedance matrix $Z_R$ and said per-unit-length admittance matrix $Y_R$ are independent of the abscissa z, and such that the characteristic impedance matrix with respect to the return conductor $Z_{RC}$ is given by $$Z_{RC} \approx \begin{pmatrix} 54.77 & 4.47 & 0.38 & 0.03 \\ 4.47 & 54.60 & 4.45 & 0.38 \\ 0.38 & 4.45 & 54.60 & 4.47 \\ 0.03 & 0.38 & 4.47 & 54.77 \end{pmatrix} \Omega \quad (18)$$

In order to compute the diagonal matrix $Z_{RL}$ defined above, the designer chooses to minimize the matrix norm $\|P_R\|_\infty$ of the matrix of the voltage reflection coefficients of the termination circuit with respect to the return conductor, this matrix norm being equal to the largest sum of the absolute values of the components of a row. In this manner, the designer obtains $$Z_{RL} \approx \begin{pmatrix} 58.8 & 0.0 & 0.0 & 0.0 \\ 0.0 & 54.2 & 0.0 & 0.0 \\ 0.0 & 0.0 & 54.2 & 0.0 \\ 0.0 & 0.0 & 0.0 & 58.8 \end{pmatrix} \Omega \quad (19)$$

for which $\|P_R\|_\infty \approx 0.082$. Consequently, the termination circuits (4) may be made of:

two resistors of about 58.8Ω, each of these resistors being connected between one of the transmission conductors (11) (14) number 1 or 4 and the return conductor; and two resistors of about 54.2Ω, each of these resistors being connected between one of the transmission conductors (12) (13) number 2 or 3 and the return conductor.

In this manner, the impedance matrix of each termination circuit with respect to the return conductor is approximately equal, in said part of said known frequency band, to a diagonal matrix of size n×n minimizing a matrix norm of the matrix of the voltage reflection coefficients of the termination circuit with respect to the return conductor. For the specialist, FIG. 9 shows that the position of the transmission conductors (11) (12) (13) (14) with respect to the interconnected copper areas (101) (102) and to the reference conductor (7) is such that the return conductor (10) may act as an electromagnetic screen. As in the case of the first embodiment, this effectively reduces the external crosstalk.

In FIG. 7, the reference conductor (7) is represented as an irregular geometrical shape, which indicates that the distance between the conductors of the interconnection (1) and the reference conductor (7) may vary as a function of the abscissa z along the interconnection. However, it is also possible that the cross section of the interconnection (1) and of the reference conductor (7) shown in FIG. 9 is independent of the abscissa z. In this case, the parameters $Z_{RG}$ and $Y_{RG}$ of the equations (5) and (6) are independent of the abscissa z, and a possible design is for instance such that, for frequencies greater than 50 MHz, $Z_{RG} \approx j\omega L_{RG}$ with $L_{RG} \approx 66.4$ nH/m and $Y_{RG} \approx j\omega C_{RG}$ with $C_{RG} \approx 469$ pF/m. In this case, it is possible to model the propagation through the interconnection using a multiconductor transmission line having n+2=6 conductors, using natural voltages referenced to ground and natural currents as variables, this multiconductor transmission line having uniform electrical characteristics over its length. For this (n+2)-conductor multiconductor transmission line, the computation of the characteristic impedance matrix with respect to the reference conductor, denoted by $Z_{GC}$, gives $$Z_{GC} \approx \begin{pmatrix} 66.67 & 16.37 & 12.28 & 11.93 & 11.90 \\ 16.37 & 66.50 & 16.35 & 12.28 & 11.90 \\ 12.28 & 16.35 & 66.50 & 16.37 & 11.90 \\ 11.93 & 12.28 & 16.37 & 66.67 & 11.90 \\ 11.90 & 11.90 & 11.90 & 11.90 & 11.90 \end{pmatrix} \Omega \quad (20)$$

Clearly, the resistances given by equation (19) for the resistors of a termination circuit (4) do not show up in equation (20). The method of the invention therefore uses a termination scheme which is very different from prior art termination schemes.

In this second embodiment, the receiving circuit (6) implements one of the known analog equalization scheme, for compensating the distortions caused by propagation because of losses at frequencies greater than 200 MHz.

The specialist notes that, in the first and second embodiments, the return conductor (10) behaving in a way as an electromagnetic screen, the pseudo-differential systems for transmission of the invention practically does not generate electromagnetic disturbances which may degrade the performances of nearby circuits, and is practically not vulnerable to electromagnetic disturbances produced by nearby circuits.

An interconnection having the structure shown in FIG. 9 could also be built inside an integrated circuit, and be used in a device of the invention designed using an approach similar to the one presented in this second embodiment.

Third Embodiment

Best Mode

Figure 10:
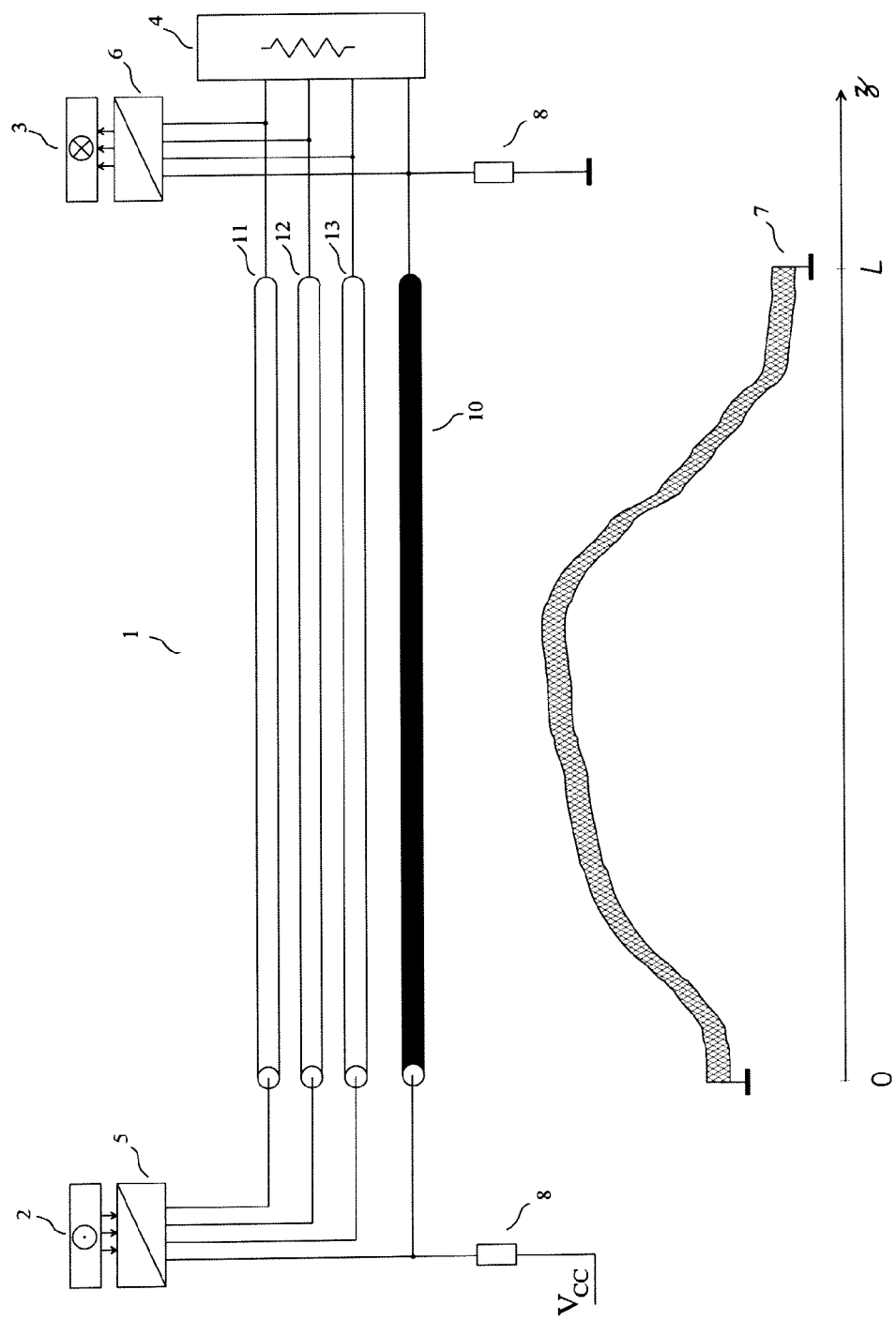
FIG. 10 shows a third embodiment.

As a third embodiment of a device for implementing the method of the invention, given by way of non-limiting example and best mode of carrying out the invention, we have represented in FIG. 10 a device of the invention comprising an interconnection (1) having n=3 transmission conductors (11) (12) (13) and a return conductor (10) distinct from the reference conductor (7). A termination circuit (4) is connected to the conductors of the interconnection (1), the impedance matrix of the termination circuit with respect to the return conductor being, in a part of the frequency band used for transmission, approximately equal to a diagonal matrix of size n×n such that all components of the matrix of the voltage reflection coefficients of the termination circuit with respect to the return conductor have an absolute value less than or equal to 1/10. The transmitting circuit (5) receives at its input the signals of the 3 channels of the source (2), and its 4 output terminals are connected to the conductors of the interconnection (1). The receiving circuit (6) has its 4 input terminals connected to the conductors of the interconnection (1) and delivers 3 "output signals of the receiving circuit" to the destination (3).

In this third embodiment, two damping circuits (8) are connected between the return conductor (10) and a node held at a constant voltage with respect to a reference terminal. For the first damping circuit, this node is a power supply terminal having a constant voltage with respect to a reference node. The second damping circuit is directly connected to a reference node.

Figure 11:
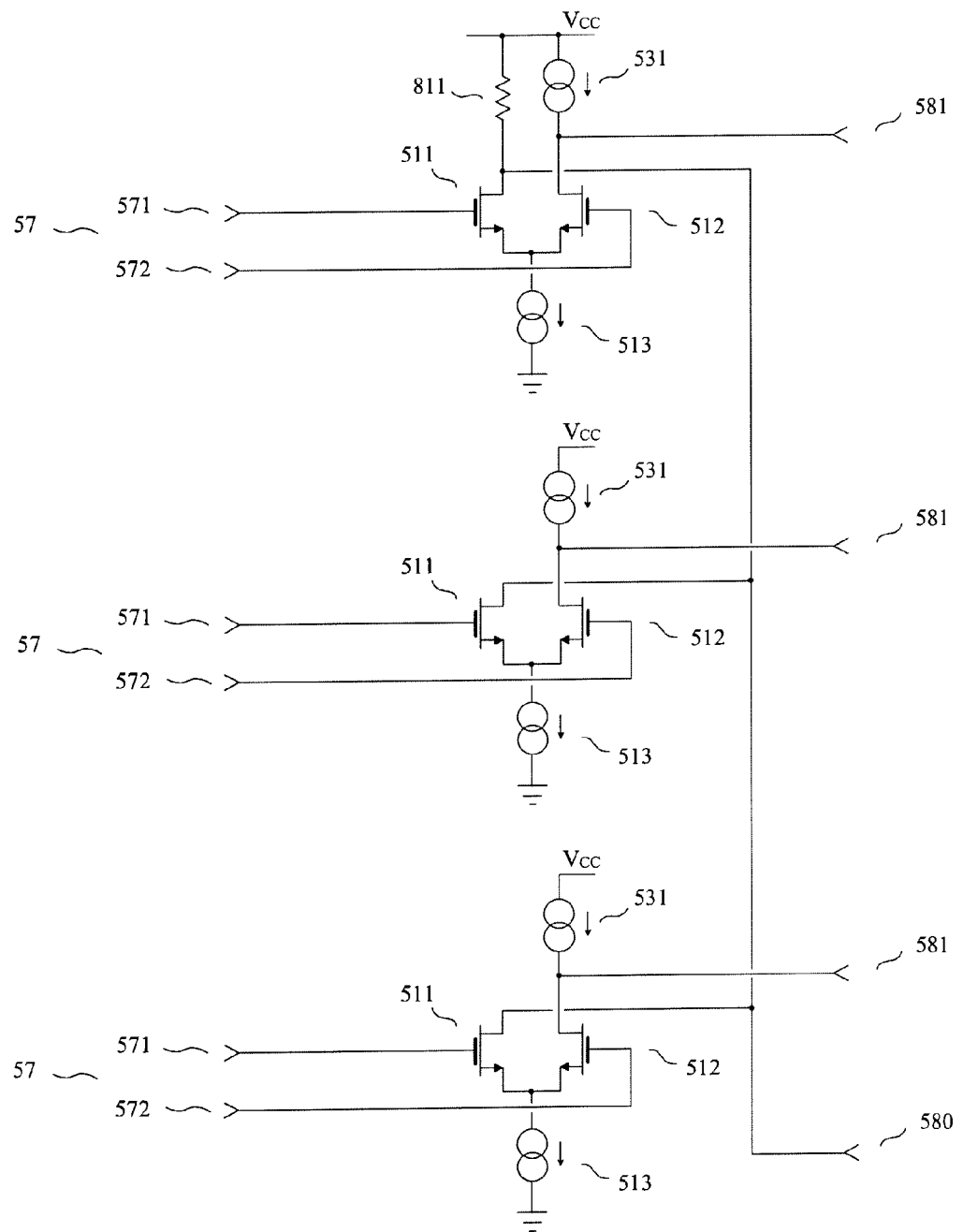
FIG. 11 shows a transmitting circuit and a damping circuit used in the third embodiment.

The transmitting circuit (5) and the first of said damping circuits (8) of FIG. 10 are shown in FIG. 11, in which:
  each of the n "input signals of the transmitting circuit" is applied to an input (57) which is a differential input comprising 2 terminals (571) (572);
  each of the n inputs (57) corresponds to the input of a differential pair made of two transistors (511) (512) whose sources are biased by a current source (513) supplying a practically constant current I;
  each of the n output terminals (581) coupled to a transmission conductor is connected to the drain of the second transistor (512) of each of said differential pairs and to a current source (531) supplying a current approximating I/2 and practically constant;
  the output terminal (580) coupled to the return conductor is connected to the drains of the n first transistors (511) of said differential pairs and to the first of said damping circuits, made of a resistor (811) connected to a power supply terminal.

The transmitting circuit shown in FIG. 11 delivers, at each output terminal (581) coupled to a transmission conductor, a natural current approximately determined by one and only one of the "input signals of the transmitting circuit". Since the resistor (811) is not part of the transmitting circuit, the total current flowing out of the output terminals of the transmitting circuit is practically −nI/2. This total current is therefore practically constant.

Figure 12:
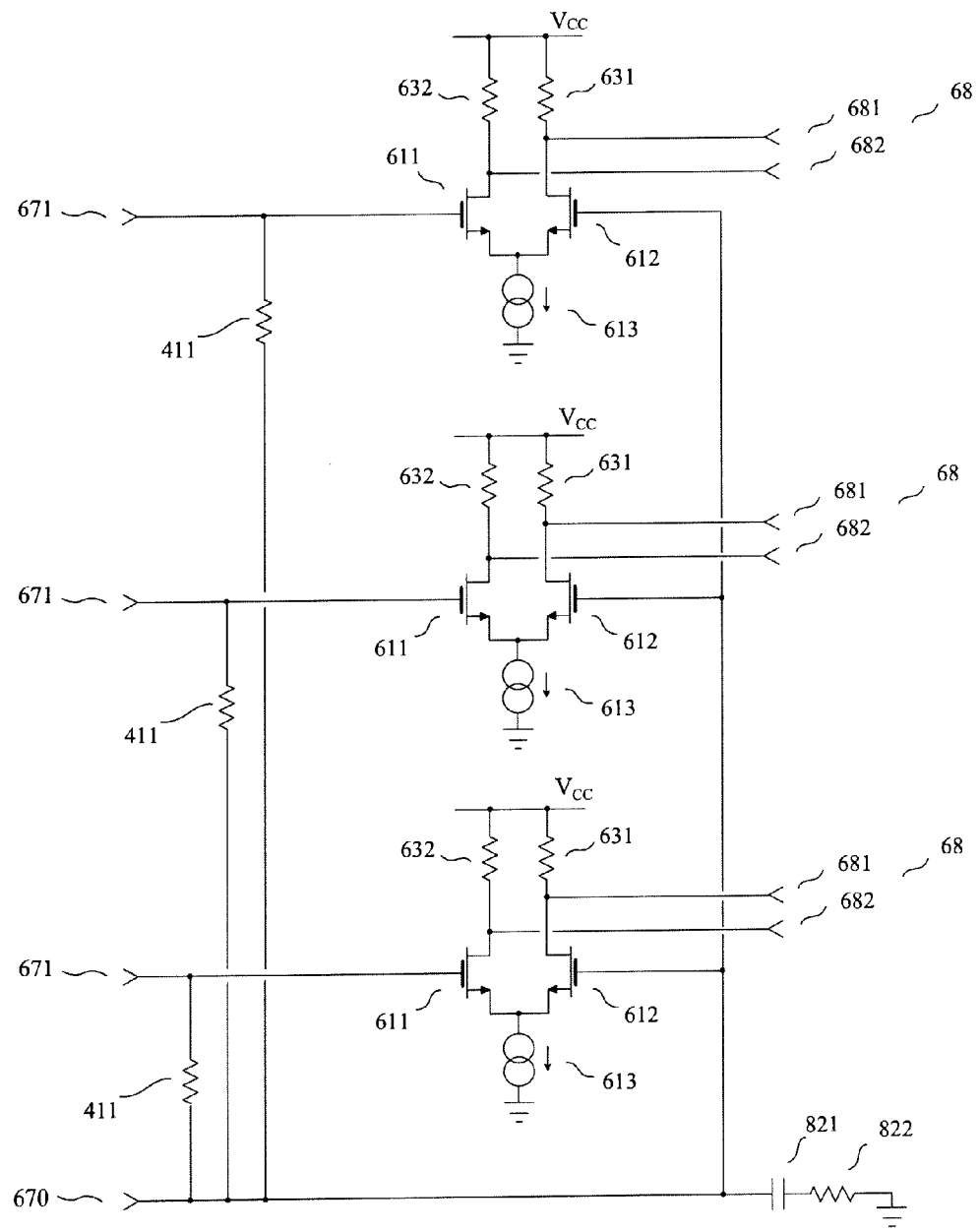
FIG. 12 shows a termination circuit, a receiving circuit and a damping circuit used in the third embodiment.

The termination circuit (4), the receiving circuit (6) and the second of said damping circuits (8) of FIG. 10 are shown in FIG. 12, in which:
  each of the n=3 "output signals of the receiving circuit" is delivered to an output (68) which is a differential output comprising 2 terminals (681) (682);
  each of the n outputs (68) corresponds to the output of a differential pair made of two transistors (611) (612) whose sources are biased by a current source (613) and whose drains are biased by two resistors (631) (632);
  each of the n input terminals (671) coupled to a transmission conductor is connected to the gate of the first transistor (611) of one of said differential pairs;
  the input terminal (670) coupled to the return conductor is connected to the gate of the n second transistors (612) of said differential pairs;
  the second damping circuit consists of a branch comprising a capacitor (821) connected in series with a resistor (822), this branch being connected between the ground and the input terminal (670) coupled to the return conductor;
  the termination circuit is made of n resistors (411) such that all components of the matrix of the voltage reflection coefficients of the termination circuit with respect to the return conductor have an absolute value less than or equal to 1/10 in said part of the frequency band used for transmission, each of these resistors being connected between one of said input terminals (671) coupled to a transmission conductor and said input terminal (670) coupled to the return conductor;

the receiving circuit consists of all components shown in FIG. 12, except the components already identified as belonging to the termination circuit or to the second damping circuit.

Let us note that the ground symbol used in FIG. 11 and FIG. 12 has exactly the same meaning as the other ground symbol used in the other figures of this application.

The specialist sees that the receiving circuit shown in FIG. 12 produces at its outputs n "output signals of the receiving circuit" corresponding each to one of the transmission channels, each of the "output signals of the receiving circuit" being mainly determined by only one of the natural voltages referenced to the return conductor.

In this third embodiment, there is only one termination because the signals are intended to propagate in a single direction and because a single termination sufficiently reduces reflections.

The damping circuit (811) of FIG. 11 and the damping circuit (821) (822) of FIG. 12 damp the resonances of the circuit consisting of the return conductor and of the reference conductor. The specialists understand that this may improve the protection against external crosstalk, and that, in the case where the parameters $Z_{RG}$ and $Y_{RG}$ of the equations (5) and (6) are roughly independent from the abscissa z, a good damping is obtained when the square of the impedance of the damping circuits is approximately equal to the ratio $Z_{RG}/Y_{RG}$. In practice, values ranging between 5Ω and 100Ω may often be suitable for the resistors (811) (822) of the damping circuits. The damping circuit (811) of FIG. 11 is a resistor which is also used for biasing the drain of several transistors of the transmitting circuit. We could therefore have considered that this resistor (811) is a part of the transmitting circuit.

The damping circuit made of a resistor (811) and the current sources (513) (531) of the transmitting circuit may be proportioned such that a zero voltage applied between the input terminals (571) (572) of the transmitting circuit for a given channel produces a practically zero voltage between the output terminals (681) (682) of the receiving circuit for the same channel.

This third embodiment is appropriate for the transmission of analog signals, and for the transmission of digital signals.

Fourth Embodiment

Figure 13:
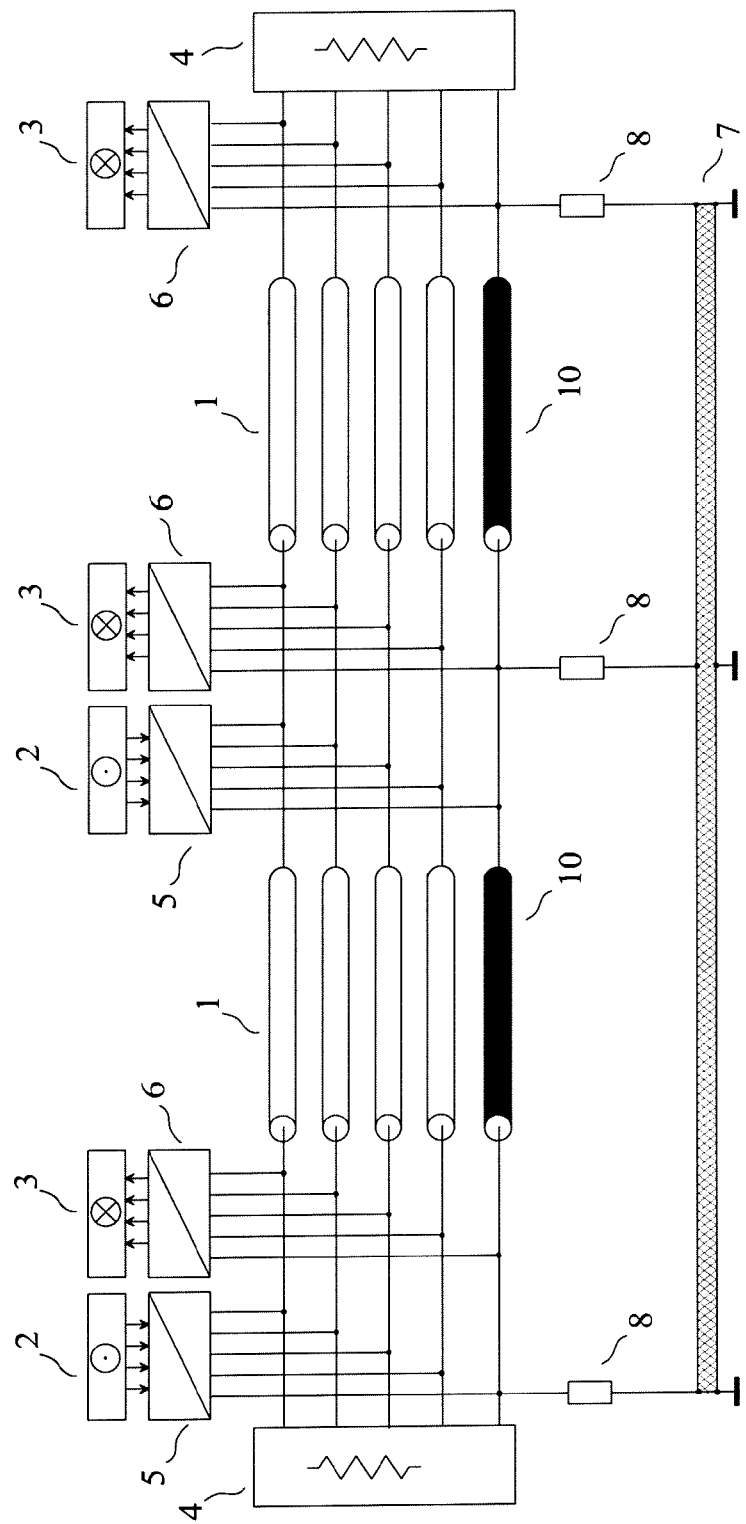
FIG. 13 shows a fourth embodiment.
Figure 14:
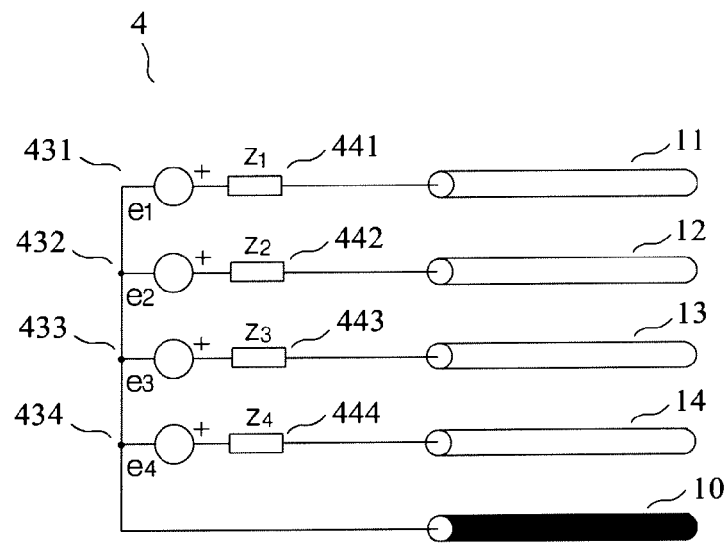
FIG. 14 shows a termination circuit.
Figure 15:
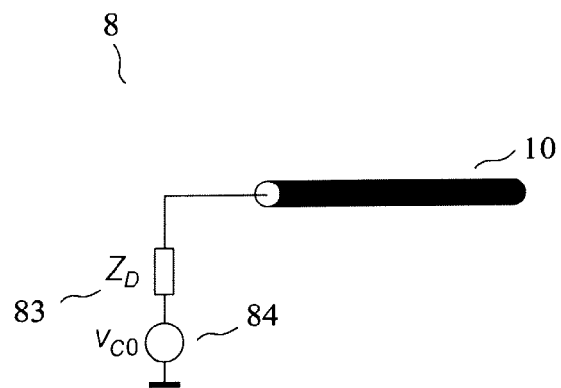
FIG. 15 shows a damping circuit.

As a fourth embodiment of a device for implementing the method of the invention, given by way of non-limiting example, we have represented in FIG. 13 a device of the invention comprising an interconnection (1) having n=4 transmission conductors and a return conductor (10) distinct from the reference conductor (7). Two termination circuits (4) are connected to the conductors of the interconnection (1), at both ends, each termination circuit being such that the impedance matrix of the termination circuit with respect to the return conductor is, in a part of the frequency band used for transmission, approximately equal to a diagonal matrix of size n×n such that all components of the matrix of the voltage reflection coefficients of the termination circuit with respect to the return conductor have an absolute value less than or equal to 1/10. The 2 transmitting circuits (5) placed at 2 different abscissa z, receive at their inputs the signals from the 4 channels of the two sources (2), and the 5 output terminals of each transmitting circuit are connected to the 5 conductors of the interconnection (1). The three receiving circuits (6) are placed at three different abscissa z and the 5 input terminals of each receiving circuit are connected to the 5 conductors of the interconnection (1). Three damping circuits (8) are connected between the return conductor (10) and the reference conductor (7). The output of each receiving circuit (6) delivers 4 "output signals of the receiving circuit" to a destination (3).

In FIG. 13, each transmitting circuit (5) is associated with a receiving circuit (6) placed at the same abscissa z as the transmitting circuit (5), the transmitting circuit (5) and the associated receiving circuit (6) being a "pseudo-differential interfacing device having a switching circuit" described in said French patent application Ser. No. 07/04949 and said international application number PCT/IB2008/051982, the transmitting circuit (5) delivering, when the transmitting circuit is in the activated state, n natural currents, each of said natural currents being mainly determined by the signal of only one channel of the source (2) connected to the transmitting circuit (5). We note that FIG. 13 shows a data bus architecture, and that the address and/or control lines needed to obtain the activated state of at most one transmitting circuit (5) at a given point in time are not shown in FIG. 13. Each of the "output signals of the receiving circuit" delivered by any one of the receiving circuits (6) is mainly determined by only one of the natural voltages referenced to the return conductor appearing at the input of the receiving circuit. Thus, the signals of the four channels of a source (2) connected to a transmitting circuit (5) in the activated state are sent to the four channels of the destinations (3) without noticeable external crosstalk.

We note that, in the device of FIG. 13, the transmitting circuits (5) and the receiving circuits (6) being connected in parallel with the interconnection (1), they may, in order not to disturb the propagation of waves along the interconnection in a detrimental way, and in order not to produce undesirable reflections at the ends of the interconnection, present high impedances to the interconnection. In the device of FIG. 13, two termination circuits (4) are necessary because waves coming from the interconnection (1) may be incident on both ends.

This fourth embodiment is intended for transmitting digital signals, and the receiving circuit (6) may be of any suitable known type of pseudo-differential receiver for digital signals, for instance one of the pseudo-differential receivers described in said patents of the United States of America U.S. Pat. Nos. 5,994,925 and 7,099,395.

In FIG. 13, the bus architecture uses a direct connection of the transmitting circuits (5) and of the receiving circuits (6) to the interconnection (1). This is not a characteristic of the invention. For instance, according to the invention, the transmitting circuits (5) and/or the receiving circuits (6) may be coupled to the interconnection (1) using one or more electromagnetic couplers. This type of coupling is for instance described in the patent of the United States of America U.S. Pat. No. 7,080,186 entitled "Electromagnetically-coupled bus system". This type of indirect coupling may provide a higher transmission bandwidth.

INDICATIONS ON INDUSTRIAL APPLICATIONS

The invention is suitable for pseudo-differential transmission between integrated circuits through an interconnection having two or more transmission conductors, the transmission presenting reduced unwanted couplings.

We note that, in the embodiments of the invention given above by way of non-limiting examples and shown in FIGS.

11 and 12, the active components are MOSFETs. This is not at all a characteristic of the invention, and specialists understand that it would have also been possible to use bipolar transistors or other types of active components. Consequently, the invention may be implemented in integrated circuits made using any applicable manufacturing process.

The invention is suitable for the protection against the noise produced by unwanted electromagnetic couplings in printed circuit boards. The invention is particularly advantageous to printed circuit boards comprising wide-band analog circuits or fast digital circuits. For transmitting in m transmission channels, the invention has the advantage of only requiring m+1 pins on an integrated circuit providing the functions of a transmitting circuit and of a receiving circuit, as opposed to 2m pins in the case of a transceiver for differential transmission.

The invention is particularly suitable for pseudo-differential transmission inside an integrated circuit, because it provides a good protection against the noise related to the currents flowing in the reference conductor and in the substrate of the integrated circuit.

The invention is suitable for an implementation in a data bus architecture.

The invention is particularly suitable for multilevel signaling, because this type of transmission scheme is more sensitive to noise than binary signaling.

The invention is particularly suitable for simultaneous bi-directional signaling, because this type of transmission scheme is more sensitive to noise than unidirectional signaling.

The invention claimed is:

1. A method for transmitting through an interconnection having n transmission conductors and a return conductor distinct from a reference conductor, n being an integer greater than or equal to 2, the method providing, in a known frequency band, m transmission channels each corresponding to a signal to be sent from the input of at least one transmitting circuit to the output of at least one receiving circuit, where m is an integer greater than or equal to 2 and less than or equal to n, the method comprising the steps of:

numbering the transmission conductors from 1 to n and defining, for any integer j greater than or equal to 1 and less than or equal to n, at any given abscissa along the interconnection, a natural current of index j as the current flowing on the transmission conductor number j, and a natural voltage referenced to the return conductor of index j as the voltage between the transmission conductor number j and the return conductor;

modeling the interconnection, in a part of the known frequency band, taking into account the lumped impedances seen by the interconnection and caused by the circuits connected to the interconnection elsewhere than at the ends of the interconnection, as a (n+1)-conductor multiconductor transmission line, the multiconductor transmission line having uniform electrical characteristics over its length, the multiconductor transmission line using the natural voltages referenced to the return conductor and the natural currents as variables;

coupling the terminals of at least one termination circuit to the return conductor and to each of the transmission conductors, said at least one termination circuit being, in said part of the known frequency band, approximately characterized, for the interconnection, by an impedance matrix with respect to the return conductor, the impedance matrix with respect to the return conductor being a matrix of size n×n, the impedance matrix with respect to the return conductor being approximately equal to a diagonal matrix;

using one said transmitting circuit receiving the m signals to be sent, the output of said transmitting circuit being coupled to at least m of the transmission conductors, the output of said transmitting circuit delivering transmission variables to the interconnection; and using one said receiving circuit delivering m output signals of the receiving circuit corresponding each to a transmission channel, the input of said receiving circuit being coupled to at least m of the transmission conductors and to the return conductor, each of the output signals of the receiving circuit being mainly determined by only one of the natural voltages referenced to the return conductor.

2. The method of claim 1, wherein the interconnection is structurally combined with the reference conductor throughout the length of the interconnection.

3. The method of claim 2, further comprising the step of determining, for the multiconductor transmission line and said part of the known frequency band, a characteristic impedance matrix with respect to the return conductor.

4. The method of claim 3, wherein, in said part of the known frequency band, each component of a matrix of voltage reflection coefficients, with respect to the return conductor, of at least one said termination circuit, has an absolute value less than or equal to $6/10$.

5. The method of claim 3, wherein, in said part of the known frequency band, the impedance matrix, with respect to the return conductor, of at least one said termination circuit, minimizes a matrix norm of a matrix of voltage reflection coefficients, with respect to the return conductor, of said at least one said termination circuit.

6. A device for transmission providing, in a known frequency band, m transmission channels each corresponding to a signal to be sent from the input of at least one transmitting circuit to the output of at least one receiving circuit, where m is an integer greater than or equal to 2, comprising:

an interconnection having n transmission conductors and a return conductor distinct from a reference conductor, n being an integer greater than or equal to m, the interconnection being such that the interconnection can be modeled, in a part of the known frequency band, taking into account the lumped impedances seen by the interconnection and caused by the circuits connected to the interconnection elsewhere than at the ends of the interconnection, as a (n+1)-conductor multiconductor transmission line, the multiconductor transmission line having uniform electrical characteristics over its length, the multiconductor transmission line using natural voltages referenced to the return conductor and natural currents as variables;

at least one said transmitting circuit receiving the m signals to be sent, the output of said at least one said transmitting circuit being coupled to at least m of the transmission conductors;

at least one said receiving circuit delivering, when said at least one said receiving circuit is in the activated state, m output signals of the receiving circuit corresponding each to a transmission channel, the input of said at least one said receiving circuit being coupled to at least m of the transmission conductors and to the return conductor, each of the output signals of the receiving circuit being mainly determined by only one of the natural voltages referenced to the return conductor; and at least one termination circuit coupled to the return conductor and to each of the transmission conductors, said at least one termination circuit being, in said part of the known frequency band, when said at least one termination circuit is in an activated state, approximately characterized, for the interconnection, by an impedance matrix with respect to the return conductor, the impedance matrix with respect to the return conductor being a matrix of size n×n approximately equal to a diagonal matrix.

7. The device of claim 6, wherein the interconnection is structurally combined with the reference conductor throughout the length of the interconnection.

8. The device of claim 7, wherein said at least one termination circuit is, in said part of the known frequency band, when said at least one termination circuit is in the activated state, such that each component of a matrix of voltage reflection coefficients, with respect to the return conductor, of said at least one termination circuit, has an absolute value less than or equal to $6/10$.

9. The device of claim 8, wherein each of the termination circuits is arranged at an end of the interconnection.

10. The device of claim 8, wherein at least one said termination circuit is, when said at least one said termination circuit is in the activated state, approximately equivalent, for the transmission conductors and the return conductor, to a network consisting of n branches, each of said branches having a first terminal and a second terminal, each of said branches consisting of a passive linear two-terminal circuit element connected in series with a voltage source delivering a constant voltage, the first terminal of each of said branches being connected to one and only one of the transmission conductors, the second terminal of each of said branches being connected to the return conductor, each of the transmission conductors being connected to the first terminal of one and only one of said branches.

11. The device of claim 8, wherein at least one said termination circuit is made of a network of n resistors, each of the resistors being connected between one of the transmission conductors and the return conductor, each of the resistors being connected to a different transmission conductor.

12. The device of claim 8, wherein the impedance matrix with respect to the return conductor, of at least one said termination circuit in the activated state, can be adjusted by electrical means.

13. The device of claim 8, wherein at least one said termination circuit has an activated state and a deactivated state, each current flowing from said at least one said termination circuit to one of the transmission conductors being substantially zero when said at least one said termination circuit is in the deactivated state.

14. The device of claim 8, further comprising one or more damping circuits coupled to the return conductor, each of the damping circuits being, for the return conductor, approximately equivalent to a network consisting of a passive two-terminal circuit element and a voltage source delivering a constant voltage, the passive two-terminal circuit element having a first terminal connected to the return conductor, the passive two-terminal circuit element having a second terminal connected to the first terminal of the voltage source, the second terminal of the voltage source being connected to the reference conductor.

* * * * *